(12) United States Patent
Sonoda et al.

(10) Patent No.: US 8,664,023 B2
(45) Date of Patent: Mar. 4, 2014

(54) DEPOSITION METHOD, DEPOSITION FILM, AND METHOD FOR PRODUCING ORGANIC ELECTROLUMINESCENCE DISPLAY DEVICE

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/976,011

(22) PCT Filed: Dec. 20, 2011

(86) PCT No.: PCT/JP2011/079453
§ 371 (c)(1),
(2), (4) Date: Jun. 25, 2013

(87) PCT Pub. No.: WO2012/090777
PCT Pub. Date: Jul. 5, 2012

(65) Prior Publication Data
US 2013/0273679 A1    Oct. 17, 2013

(30) Foreign Application Priority Data
Dec. 27, 2010   (JP) .................... 2010-291203

(51) Int. Cl.
*H01L 21/00* (2006.01)
*H01L 21/40* (2006.01)
*H01L 51/40* (2006.01)

(52) U.S. Cl.
USPC .................. 438/29; 438/34; 438/69; 438/82; 438/99; 438/680; 257/E21.002; 257/E21.299; 257/E21.527; 257/E31.095; 257/E31.022

(58) Field of Classification Search
USPC .................. 438/29, 34, 69, 82, 99, 680; 257/E21.002, E21.299, E21.527, 257/E31.095, E31.022
See application file for complete search history.

(56) References Cited

U.S. PATENT DOCUMENTS

| 5,742,129 A | 4/1998 | Nagayama et al. |
|---|---|---|
| 6,294,892 B1 | 9/2001 | Utsugi et al. |
| 6,358,765 B2 * | 3/2002 | Tanaka .......................... 438/29 |
| 7,833,633 B2 * | 11/2010 | Lee et al. ...................... 428/690 |
| 2004/0123804 A1 | 7/2004 | Yamazaki et al. |
| 2005/0120959 A1 | 6/2005 | Isoda et al. |

FOREIGN PATENT DOCUMENTS

| JP | 8-227276 A | 9/1996 |
|---|---|---|
| JP | 2000-188179 A | 7/2000 |

(Continued)

OTHER PUBLICATIONS

International Search Report received for PCT Patent Application No. PCT/JP2011/079453 mailed on Mar. 6, 2012, 4 pages. (2 pages of English Translation and 2 pages of ISR).

*Primary Examiner* — Mohsen Ahmadi
(74) *Attorney, Agent, or Firm* — Morrison & Foerster LLP

(57) ABSTRACT

A vapor deposition method of the present invention includes the steps of (i) preparing a mask unit including a shadow mask (81) and a vapor deposition source (85) fixed in position relative to each other, (ii) while moving at least one of the mask unit and the film formation substrate (200) relative to the other, depositing a vapor deposition flow, emitted from the vapor deposition source (85), onto a vapor deposition region (210), and (iii) adjusting the position of a second shutter (111) so that the second shutter (111) blocks a vapor deposition flow traveling toward the vapor deposition unnecessary region (210).

14 Claims, 24 Drawing Sheets

(56) References Cited

FOREIGN PATENT DOCUMENTS

| JP | 2004-146369 A | 5/2004 |
| JP | 2004214185 A | 7/2004 |
| JP | 2005-126821 A | 5/2005 |
| JP | 2010-116591 A | 5/2010 |
| JP | 2010272229 A | 12/2010 |

* cited by examiner

Substrate Scanning Direction

DEPOSITION METHOD, DEPOSITION FILM, AND METHOD FOR PRODUCING ORGANIC ELECTROLUMINESCENCE DISPLAY DEVICE

CROSS REFERENCE TO RELATED APPLICATIONS

This is a U.S. National Phase patent application of PCT/JP2011/079453, filed Dec. 20, 2011, which claims priority to Japanese patent application no. 2010-291203, filed Dec. 27, 2010, each of which is hereby incorporated by reference in the present disclosure in its entirety.

TECHNICAL FIELD

The present invention relates to (i) a vapor deposition method involving use of a vapor deposition mask, (ii) a vapor-deposited film formed by the vapor deposition method, and (iii) a method for producing an organic electroluminescent display device, the method involving the vapor deposition method.

BACKGROUND ART

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescent (hereinafter abbreviated to "EL") element which uses electroluminescence of an organic material and that (ii) is an all-solid-state flat-panel display which is excellent in, for example, low-voltage driving, high-speed response, and self-emitting.

An organic EL display device includes, for example, (i) a substrate made up of members such as a glass substrate and TFTs (thin film transistors) provided to the glass substrate and (ii) organic EL elements provided on the substrate and connected to the TFTs.

An organic EL element is a light-emitting element capable of high-luminance light emission based on low-voltage direct-current driving, and includes in its structure a first electrode, an organic EL layer, and a second electrode stacked on top of one another in that order, the first electrode being connected to a TFT. The organic EL layer between the first electrode and the second electrode is an organic layer including a stack of layers such as a hole injection layer, a hole transfer layer, an electron blocking layer, a luminescent layer, a hole blocking layer, an electron transfer layer, and an electron injection layer.

A full-color organic EL display device typically includes, aligned on a substrate as sub-pixels, organic EL elements including respective luminescent layers of red (R), green (G), and blue (B). Such a full-color organic EL display device carries out a color image display by, with use of TFTs, selectively causing the organic EL elements to each emit light with a desired luminance.

Producing an organic EL display device requires forming luminescent layers for respective organic EL elements, the luminescent layers each (i) being made of an organic luminescent material that emits light of a color and (ii) having a predetermined pattern. Further, for a layer requiring no patterns to be formed for individual organic EL elements, the above production uniformly forms a thin film entirely over a pixel region made up of organic EL elements.

The formation of a luminescent layer in a predetermined pattern is known to be carried out by a method such as a vacuum vapor deposition method, an inkjet method, and a laser transfer method. A low-molecular organic EL display (OLED), for example, is frequently produced by a vacuum deposition method.

The vacuum deposition method uses a mask (also called "shadow mask") having an aperture in a predetermined pattern. The vacuum deposition method causes a vapor-deposited surface of a substrate to which the mask is fixed in close contact therewith to face a vapor deposition source, and then causes vapor deposition particles (film formation material) from the vapor deposition source to be deposited onto the vapor-deposited surface through the aperture of the mask. This forms a thin film in a predetermined pattern. The above vapor deposition is carried out for each color of the luminescent layers (this technique is referred to as "selective vapor deposition").

Patent Literatures 1 and 2, for example, each disclose a method for carrying out selective vapor deposition for luminescent layers of respective colors by sequentially moving a mask relative to a substrate. Such a method uses a mask equivalent in size to the substrate, and fixes the mask during vapor deposition at such a position that the mask covers a vapor-deposited surface of the substrate.

CITATION LIST

Patent Literature 1
Japanese Patent Application Publication, Tokukaihei, No. 8-227276 A (Publication Date: Sep. 3, 1996)
Patent Literature 2
Japanese Patent Application Publication, Tokukai, No. 2000-188179 A (Publication Date: Jul. 4, 2000)

SUMMARY OF INVENTION

Technical Problem

In such a conventional selective vapor deposition method, a larger substrate requires a larger-sized mask. A larger mask, however, tends to leave a gap between the substrate and itself due to, for example, self-weight bending and/or elongation of the mask. In addition, such a gap varies in width depending on the position of a vapor-deposited surface on the substrate. With a conventional selective vapor deposition method, it is thus difficult to form a pattern with high precision. Further, a conventional selective vapor deposition method causes, for example, mispositioning of vapor deposition and/or color mixture, thereby making it difficult to achieve high resolution.

A larger mask requires, for example, an extremely large frame for holding the mask, which in turn causes the mask and the frame to be heavier as well. This makes it difficult to handle the mask and the frame, and may thus decrease productivity, safety and/or the like. A larger mask further requires, for example, a vapor deposition device and other devices accompanying the vapor deposition device to be each extremely large and complex as well. This makes it difficult to design such devices, and increases the installation costs as well.

It is thus difficult to use a conventional selective vapor deposition method for a large-sized substrate. No method has been achieved that can carry out selective vapor deposition at a mass production level with use of a large-sized substrate that exceeds, for example, 60 inches in size.

One feasible method that solves the above problem is a scan vapor deposition method, which uses a shadow mask smaller in size than a substrate and which forms a pattern of an organic film at a predetermined position on the substrate by, in the state where (i) a vapor deposition source and the shadow mask are integrated with each other and (ii) the gap between the shadow mask and the substrate is maintained, carrying out vapor deposition while scanning either the vapor deposition source and the shadow mask integrated with each other or the substrate. The scan vapor deposition method, which may use a small shadow mask, avoids the above problem.

The scan vapor deposition method, however, poses a different problem: It cannot, as described below, prevent vapor deposition from being carried out on a region requiring no vapor deposition (hereinafter referred to as "vapor deposition unnecessary region).

For example, a TFT substrate for use in an organic EL display device includes a terminal section around a pixel region. If there is a vapor-deposited film in such a terminal section, since an organic vapor-deposited film for an organic EL element is typically high in resistance, electric connection with an external circuit is difficult to establish at such a portion. A vapor-deposited film that is low in resistance causes a current leak to occur, resulting in an electric defect as well. The above portion at which electric connection is established with an external circuit is a vapor deposition unnecessary region.

The scan vapor deposition method uses a shutter placed in front of an injection hole of a vapor deposition source, and opens or closes the shutter to deposit or block vapor deposition particles emitted from the vapor deposition source. The scan vapor deposition method includes a shadow mask integrated with the vapor deposition source, and forms an organic film on a substrate when the substrate passes through a position directly above an aperture section (hereinafter referred to as "mask aperture") of the shadow mask. This means that if the shutter is constantly open, vapor deposition is carried out on a substrate from end to end (vapor deposition particles are deposited on a vapor deposition unnecessary region). Preventing vapor deposition particles from being deposited on a vapor deposition unnecessary region simply requires the shutter to be closed when a substrate scan has found that the vapor deposition unnecessary region reaches a position directly above a mask aperture. However, there also remains, directly above the mask aperture, a region (vapor deposition region) requiring vapor deposition at the same time. Closing the shutter thus decreases the amount of vapor deposition on a vapor deposition region, and causes a film on the vapor deposition region to be thinner than intended. Therefore, simply closing the shutter cannot prevent vapor deposition particles from being deposited on a vapor deposition unnecessary region.

The present invention has been accomplished to solve the above problem. It is an object of the present invention to provide a vapor deposition method that prevents vapor deposition on a vapor deposition unnecessary region without reducing the amount of vapor deposition on an edge section of a vapor deposition region.

Solution to Problem

In order to solve the above problem(s), a vapor deposition method of the present invention is a vapor deposition method for forming a film in a predetermined pattern on a film formation substrate, the vapor deposition method including the steps of: (a) preparing a mask unit including: a vapor deposition mask having an opening; and a vapor deposition source provided so as to face the vapor deposition mask, the vapor deposition mask and the vapor deposition source being fixed in position relative to each other; (b) while moving at least a first one of the mask unit and the film formation substrate relative to a second one thereof, depositing vapor deposition particles, emitted from the vapor deposition source, through the opening onto a vapor deposition region of the film formation substrate; and (c) blocking, with use of a shutter member, a first portion of a vapor deposition flow of the vapor deposition particles which first portion travels toward a vapor deposition unnecessary region of the film formation substrate.

The above arrangement prepares a movable shutter member, and adjusts the position of the shutter member so that the shutter member blocks a portion of a vapor deposition flow of vapor deposition particles traveling from the vapor deposition source through the opening of the vapor deposition mask toward the film formation substrate, the portion traveling toward a vapor deposition unnecessary region of the film formation substrate. The above arrangement can thus prevent vapor deposition on a vapor deposition unnecessary region without reducing the amount of vapor deposition on an edge section of a vapor deposition region.

The above arrangement allows for omission of a step of wiping off, with use of a solvent, vapor deposition particles deposited on a vapor deposition unnecessary region, and can thus prevent a problem arising from such a wiping step. The above arrangement eliminates the need to include a step of protecting a vapor deposition unnecessary region to prevent vapor deposition thereon. Further, the above arrangement can simply change the positional relationship between the shutter member and the vapor deposition source to handle a vapor deposition unnecessary region in various sizes. The above arrangement consequently makes it possible to provide a vapor deposition method that prevents vapor deposition on a vapor deposition unnecessary region without reducing the amount of vapor deposition on an edge section of a vapor deposition region.

A method of the present invention for producing an organic electroluminescent display device is a method for producing an organic electroluminescent display device, the method including: a TFT-substrate-and-first-electrode preparing step of preparing a first electrode on a TFT substrate; an organic layer vapor deposition step of depositing, on the TFT substrate, an organic layer including at least a luminescent layer; a second electrode vapor deposition step of depositing a second electrode; and a sealing step of sealing, with use of a sealing member, an organic electroluminescent device including the organic layer and the second electrode, at least one of the organic layer vapor deposition step, the second electrode vapor deposition step, and the sealing step including the step (a), the step (b), and the step (c) of the vapor deposition method.

The above arrangement makes it possible to produce an inexpensive organic electroluminescent device that is free from electric defects.

Advantageous Effects of Invention

As described above, a vapor deposition method of the present invention is a vapor deposition method for forming a film in a predetermined pattern on a film formation substrate, the vapor deposition method including the steps of: (a) preparing a mask unit including: a vapor deposition mask having an opening; and a vapor deposition source provided so as to face the vapor deposition mask, the vapor deposition mask and the vapor deposition source being fixed in position relative to each other; (b) while moving at least a first one of the mask unit and the film formation substrate relative to a second one thereof, depositing vapor deposition particles, emitted from the vapor deposition source, through the opening onto a vapor deposition region of the film formation substrate; and (c) blocking, with use of a shutter member, a first portion of a vapor deposition flow of the vapor deposition particles which first portion travels toward a vapor deposition unnecessary region of the film formation substrate.

The above arrangement can advantageously prevent vapor deposition on a vapor deposition unnecessary region without reducing the amount of vapor deposition on an edge section of a vapor deposition region.

Figure 5:
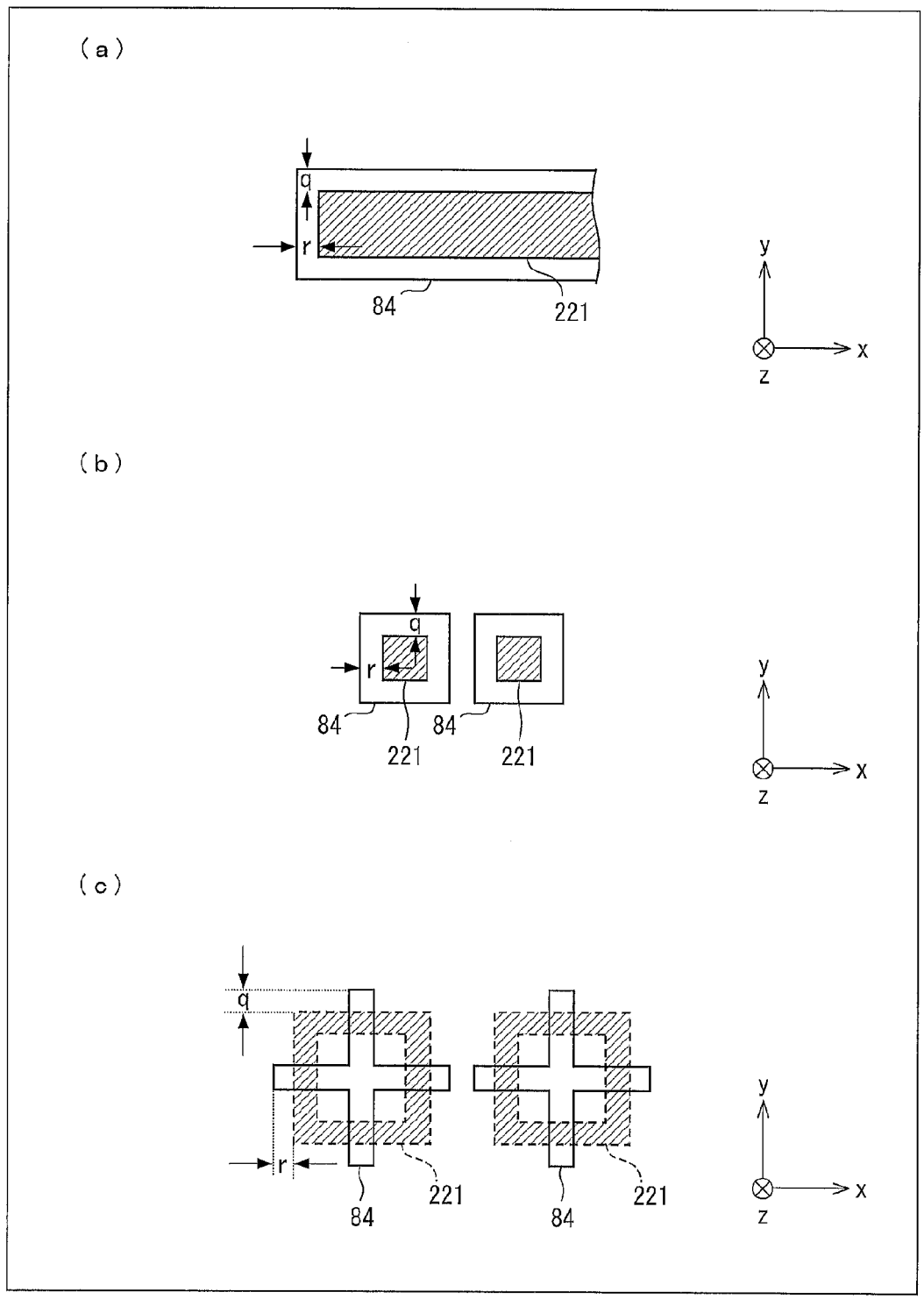

(a) through (c) of FIG. 5 are each a diagram illustrating example shapes of alignment markers provided to the film formation substrate and a vapor deposition mask according to one embodiment of the present invention.

Figure 6:
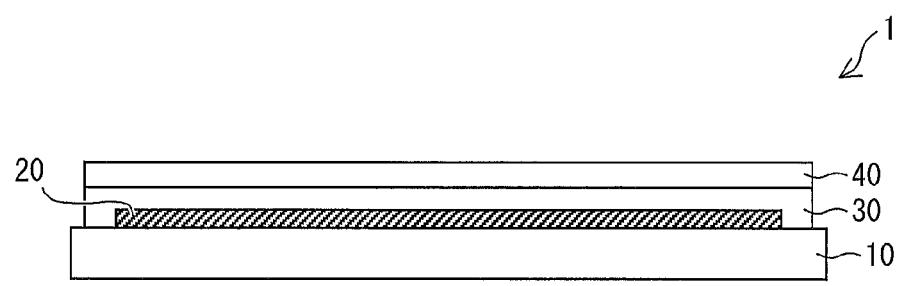

FIG. 6 is a cross-sectional view schematically illustrating a configuration of an organic EL display device for carrying out an RGB full color display.

Figure 7:
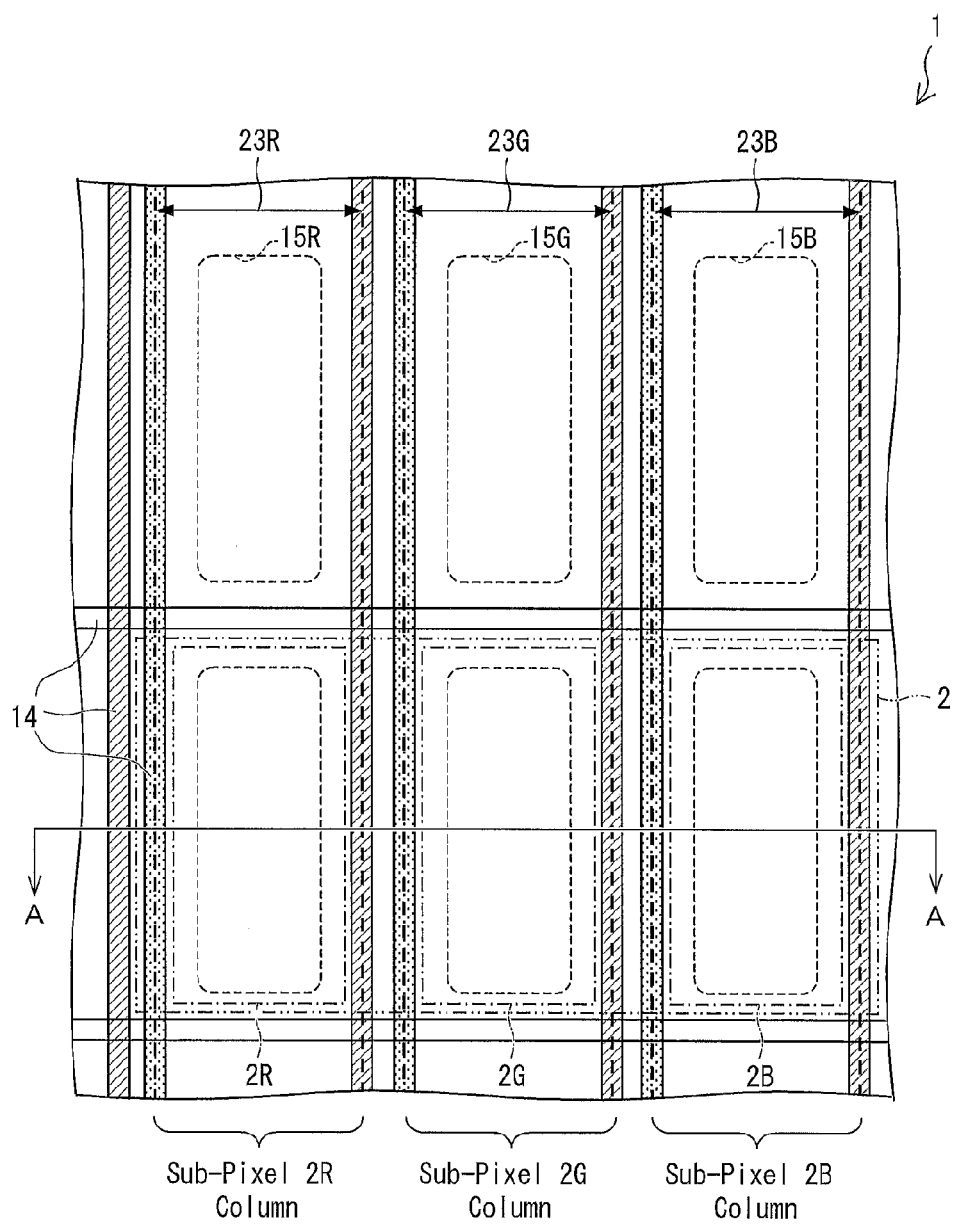

FIG. 7 is a plan view illustrating an arrangement of pixels constituting the organic EL display device illustrated in FIG. 6.

Figure 8:
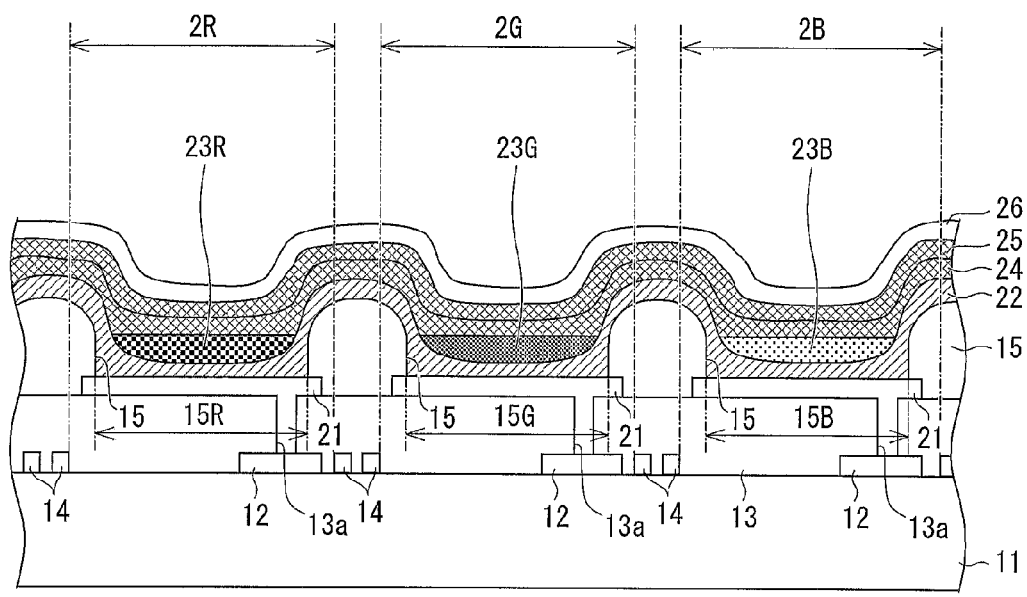

FIG. 8 is a cross-sectional view, taken along line A-A, illustrating a TFT substrate in the organic EL display device illustrated in FIG. 7.

Figure 9:
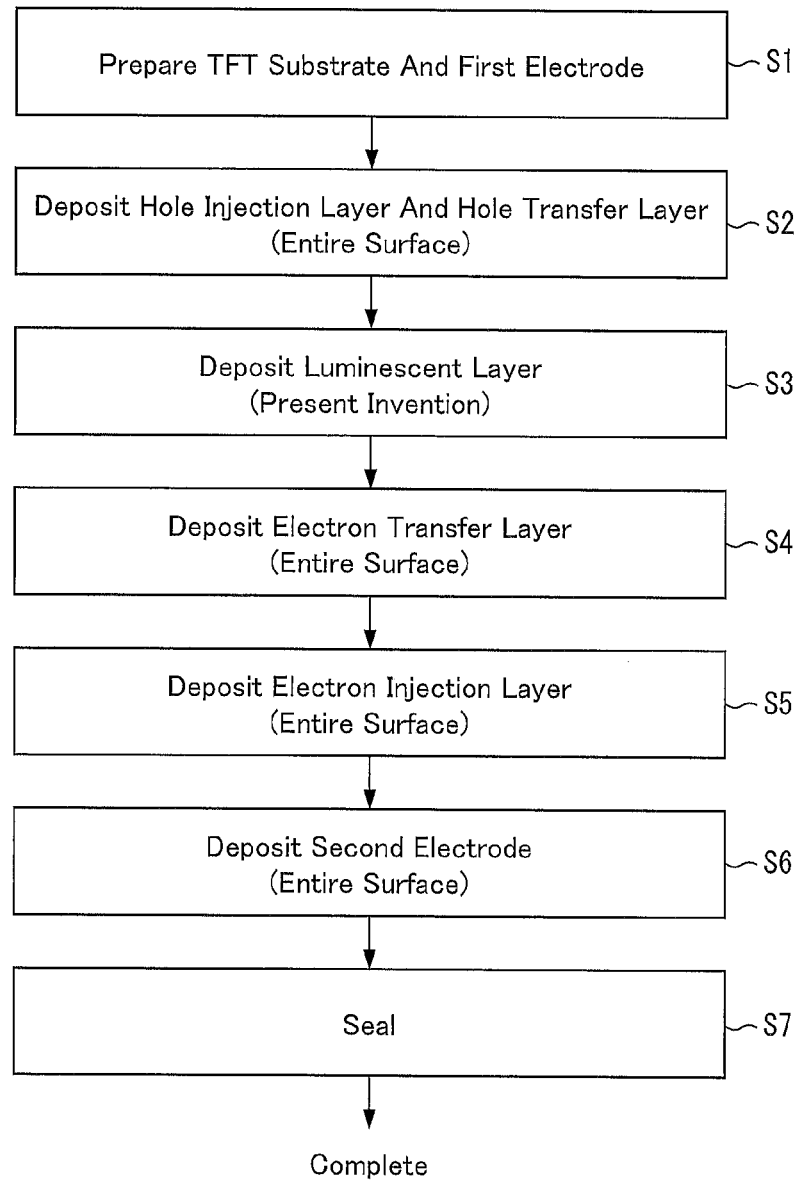

FIG. 9 is a flowchart indicating successive steps for producing the organic EL display device according to one embodiment of the present invention.

Figure 10:
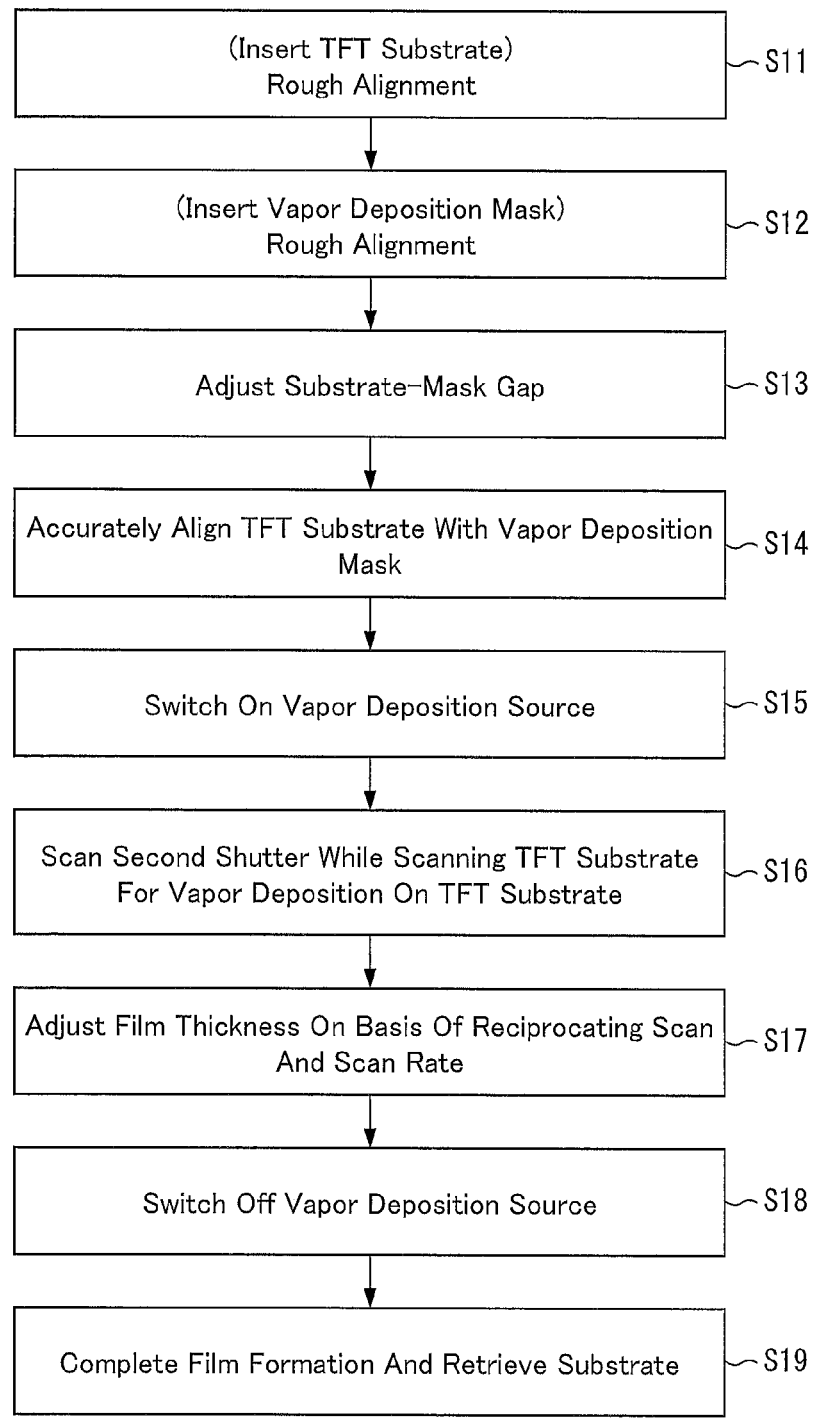

FIG. 10 is a flowchart indicating an example method for forming a predetermined pattern on a TFT substrate with use of the vapor deposition device according to one embodiment of the present invention.

Figure 11:
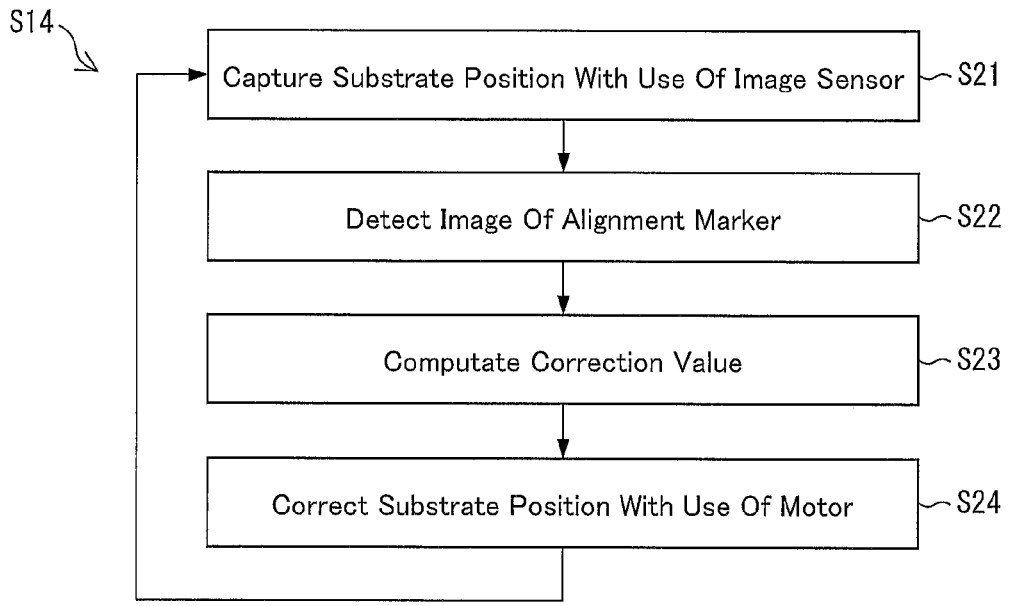

FIG. 11 is a flowchart indicating an alignment adjustment method.

Figure 12:
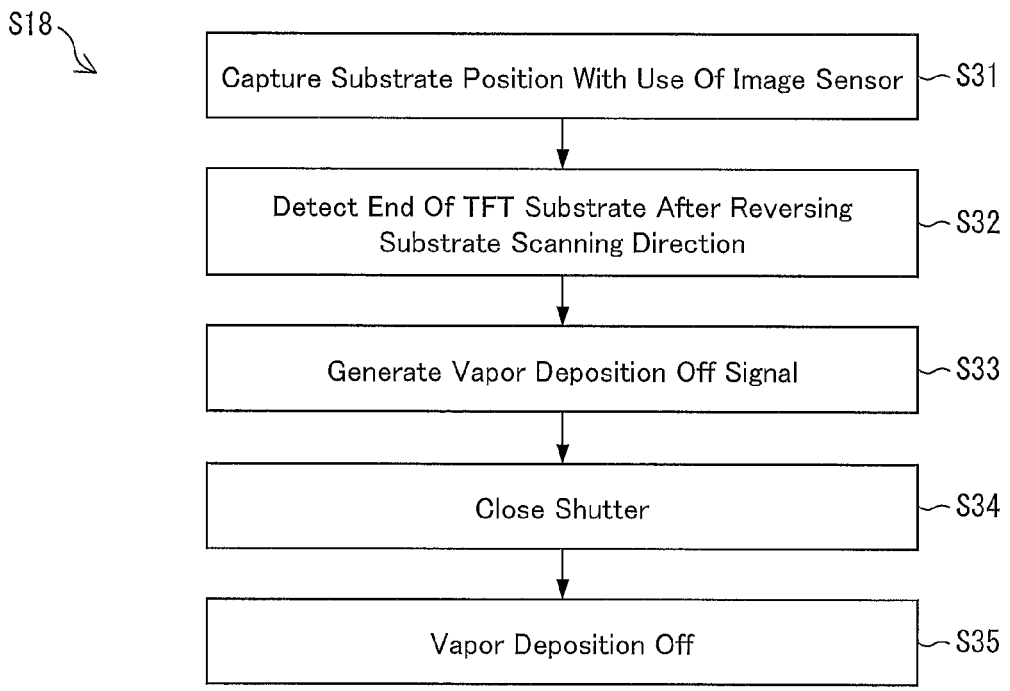

FIG. 12 is a flowchart indicating a flow of a vapor deposition control carried out when vapor deposition is turned OFF.

Figure 13:
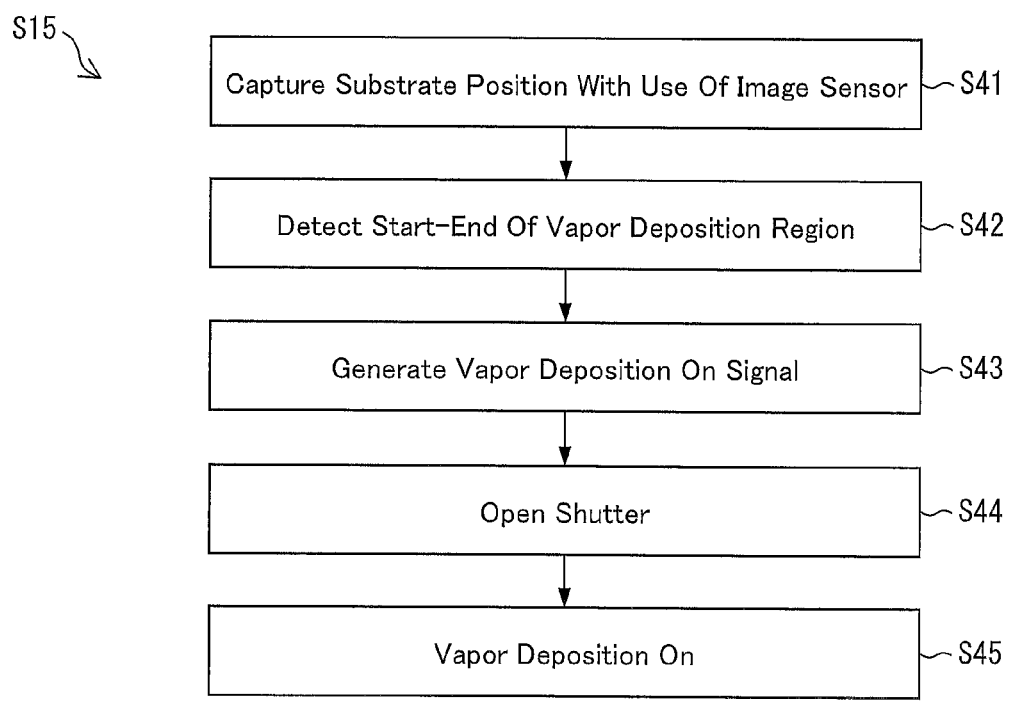

FIG. 13 is a flowchart indicating a flow of a vapor deposition control carried out when vapor deposition is turned ON.

Figure 14:
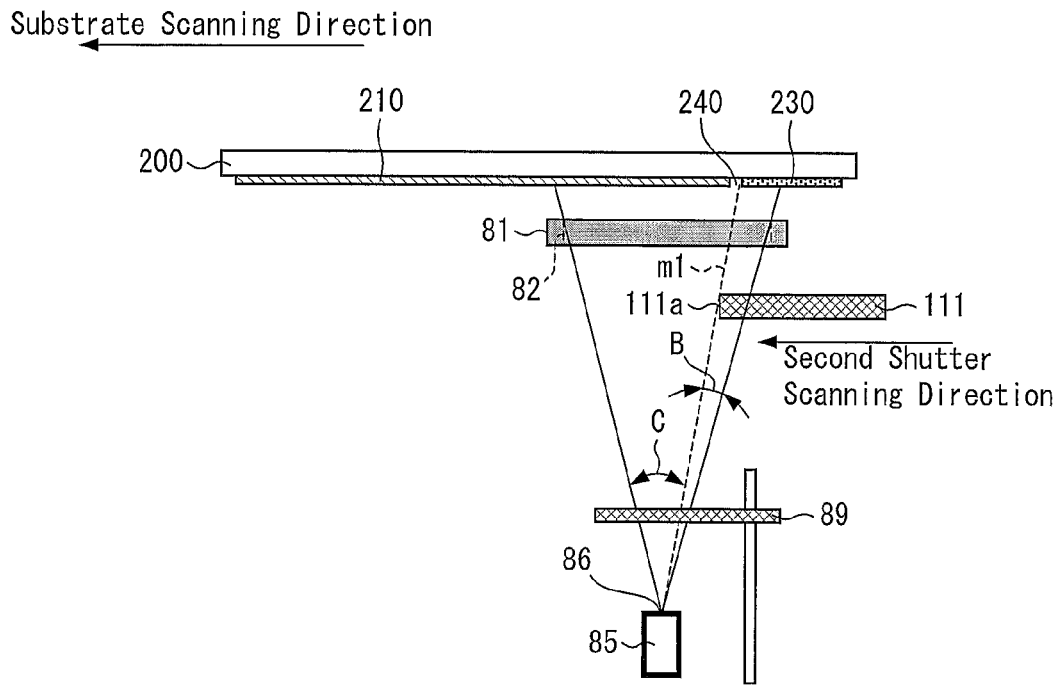

FIG. 14 is a side view illustrating a method for scanning a second shutter in a vapor deposition method of Embodiment 1.

Figure 15:
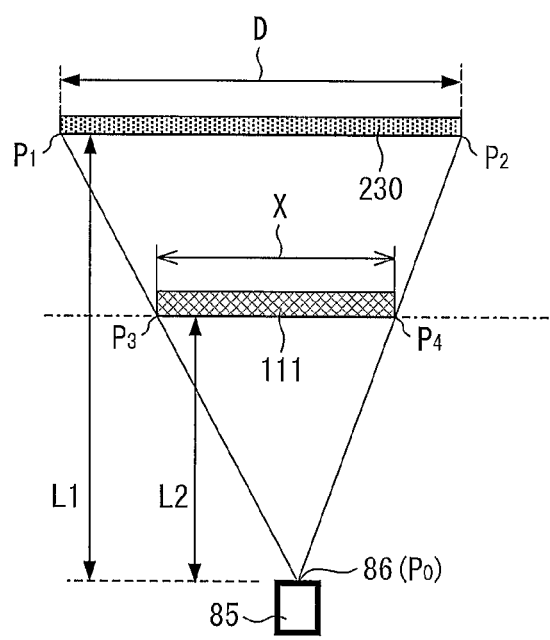

FIG. 15 is a diagram illustrating a method for determining the length of a second shutter in accordance with Embodiment 1.

Figure 16:
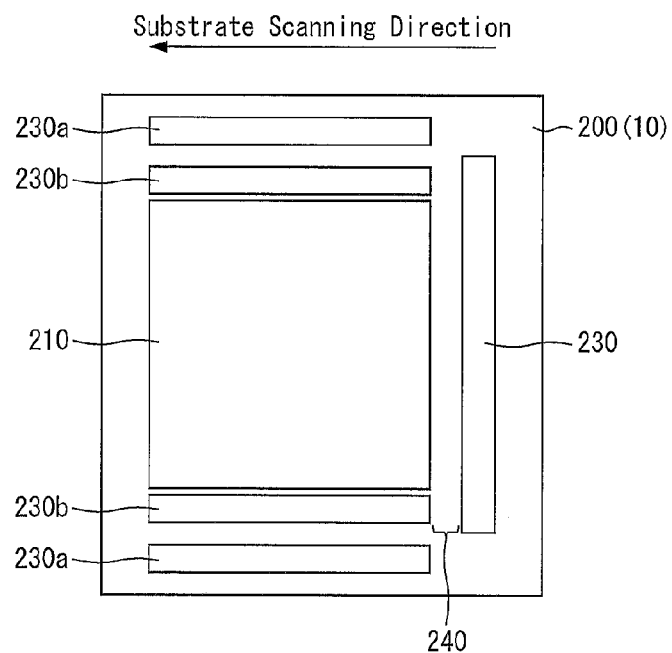

FIG. 16 is a plan view of a film formation substrate as viewed from a vapor deposition source in accordance with Embodiment 1.

Figure 17:
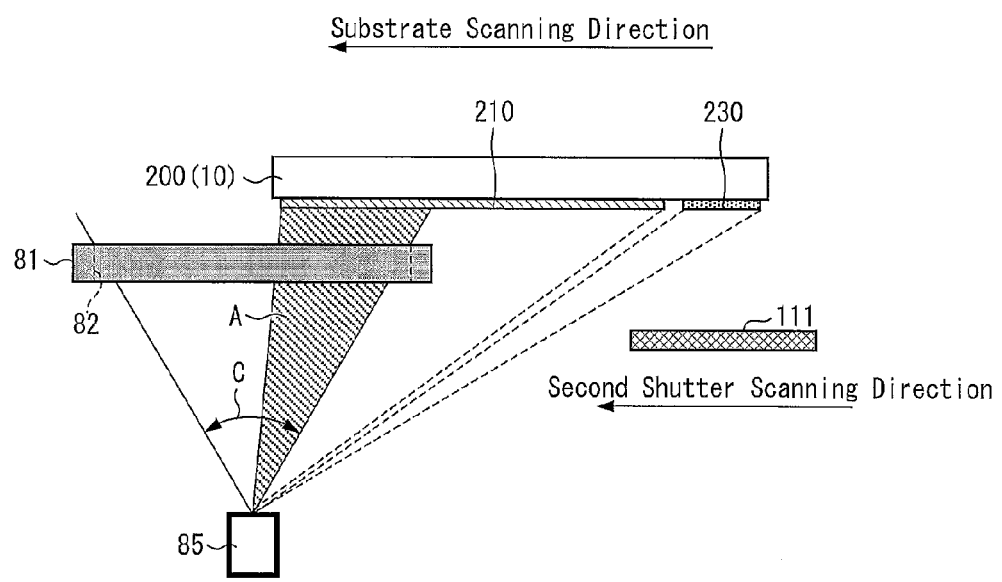

FIG. 17 is a diagram illustrating an escape period for a second shutter in accordance with Embodiment 1.

Figure 18:
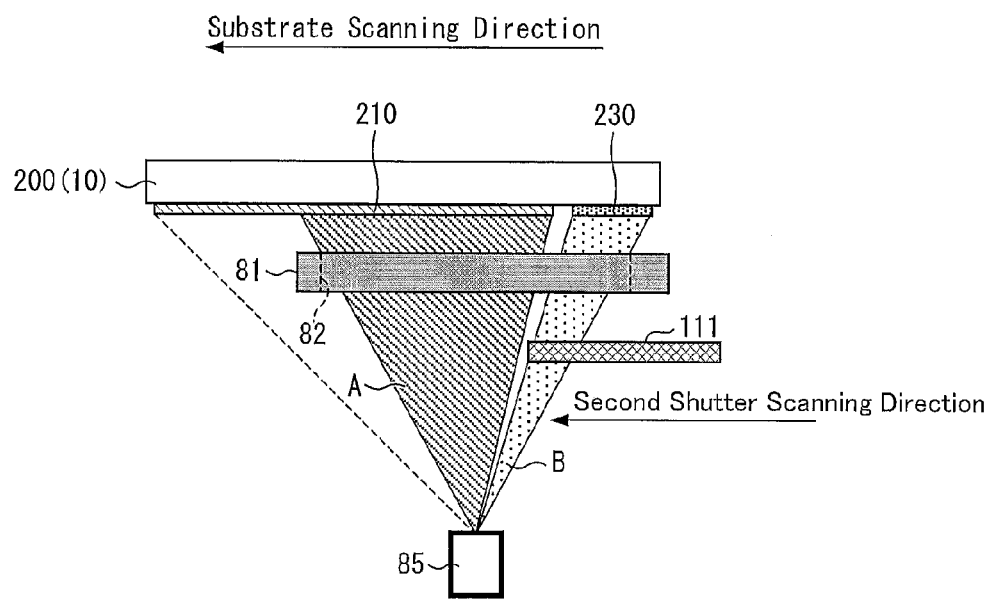

FIG. 18 is a diagram illustrating a control period 1 for a second shutter in accordance with Embodiment 1.

Figure 19:
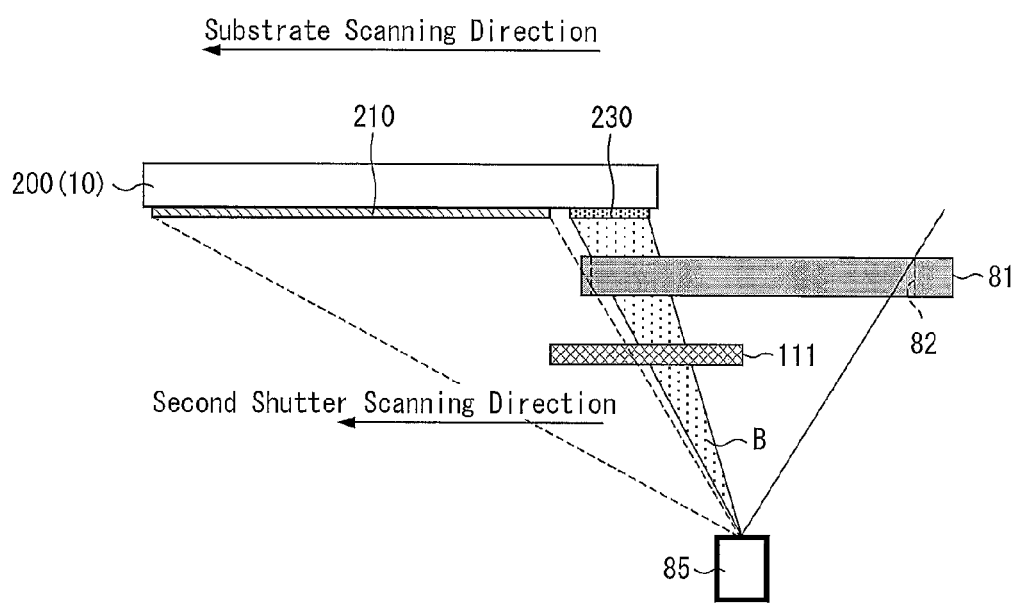

FIG. 19 is a diagram illustrating a control period 2 for a second shutter in accordance with Embodiment 1.

Figure 20:
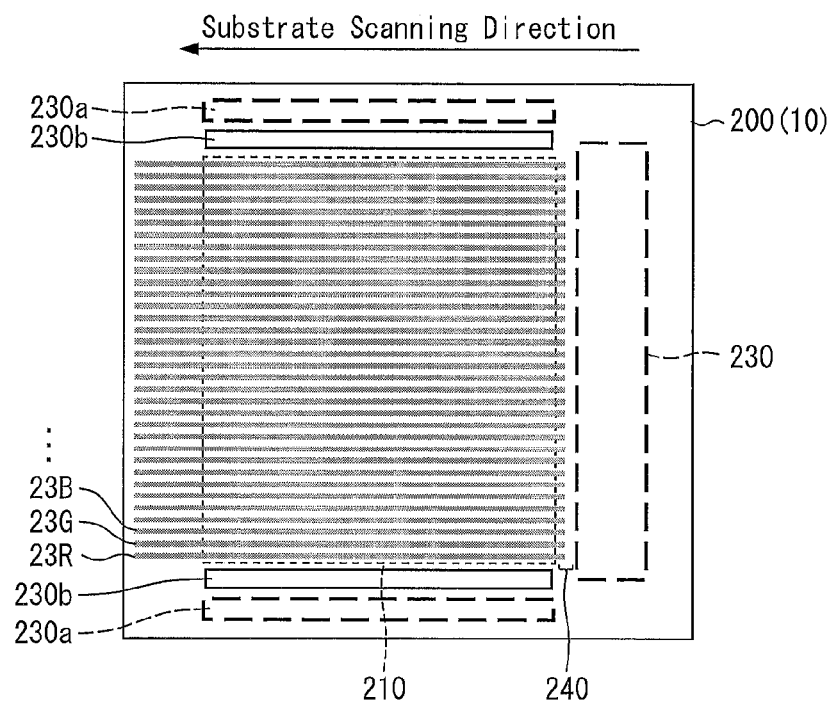

FIG. 20 is a plan view illustrating luminescent layers formed by a vapor deposition method of Embodiment 1.

Figure 21:
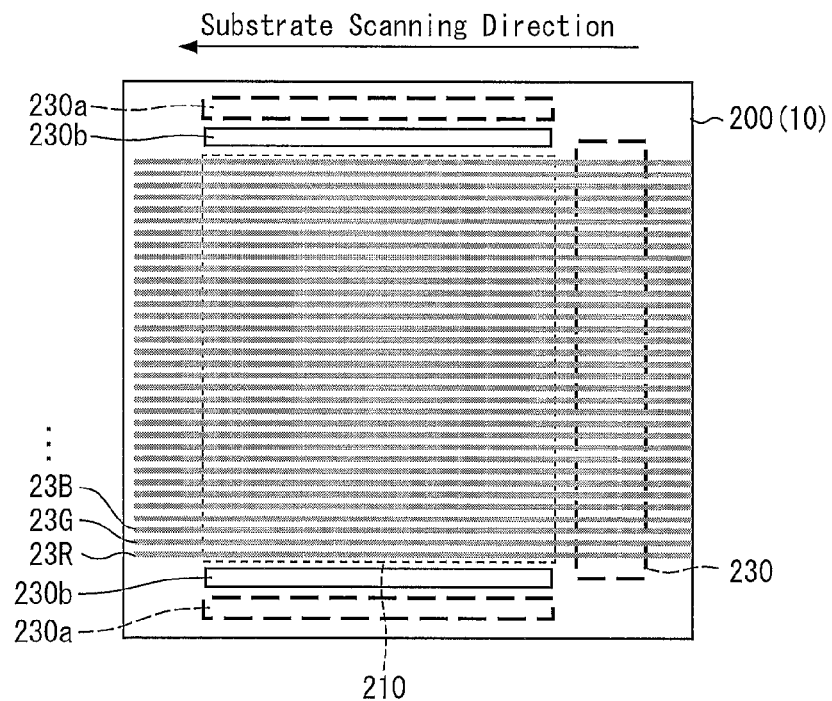

FIG. 21 is a plan view illustrating luminescent layers formed by a conventional vapor deposition method.

Figure 22:
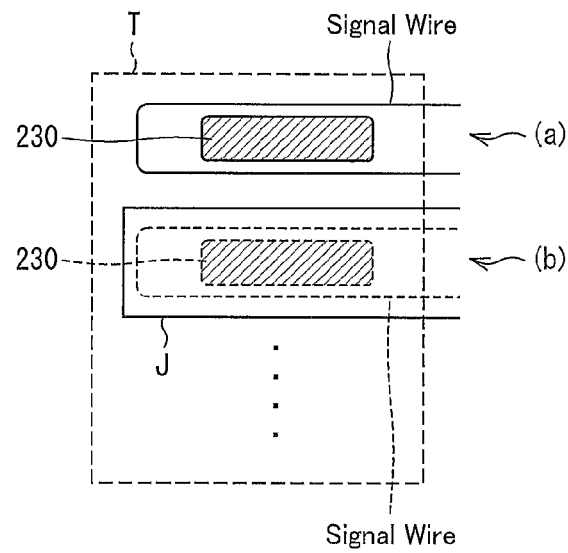

(a) of FIG. 22 is a diagram illustrating how a terminal section is connected to a terminal section region in accordance with Embodiment 1, and (b) of FIG. 22 is a diagram illustrating how a terminal section is connected to a terminal section region in accordance with a conventional technique.

Figure 23:
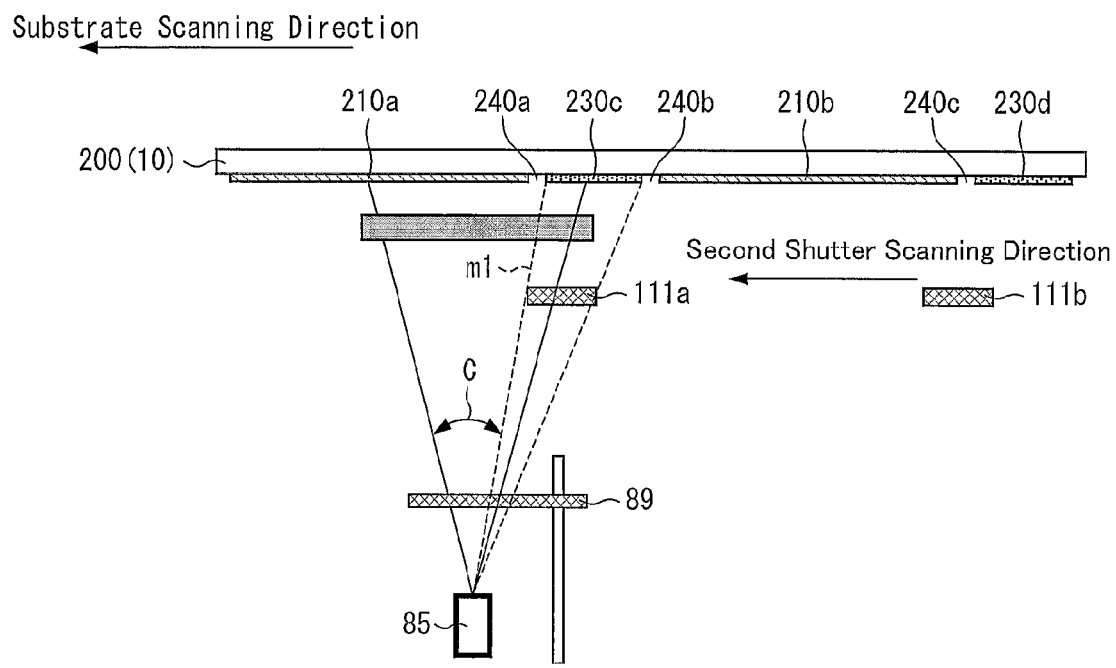

FIG. 23 is a side view illustrating a method for scanning a second shutter in a vapor deposition method of Embodiment 2.

Figure 24:
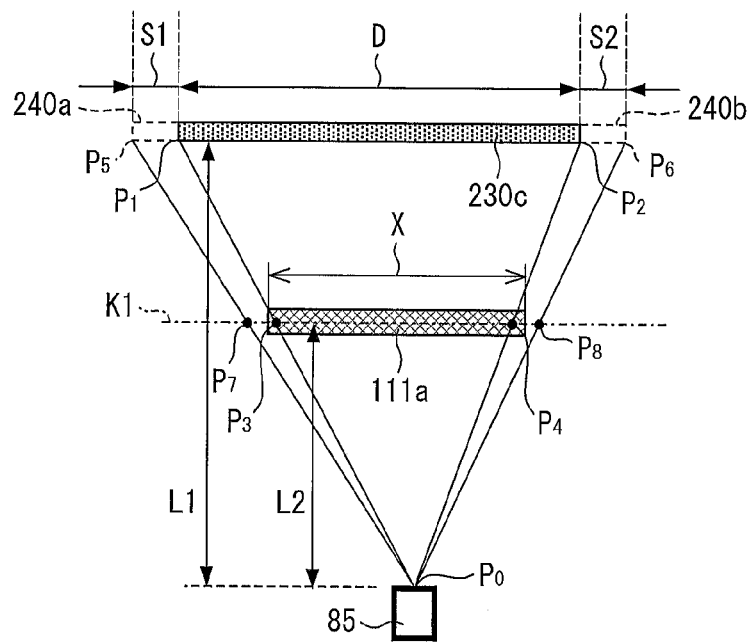

FIG. 24 is a diagram illustrating a method for determining the length of a second shutter in accordance with Embodiment 2.

Figure 25:
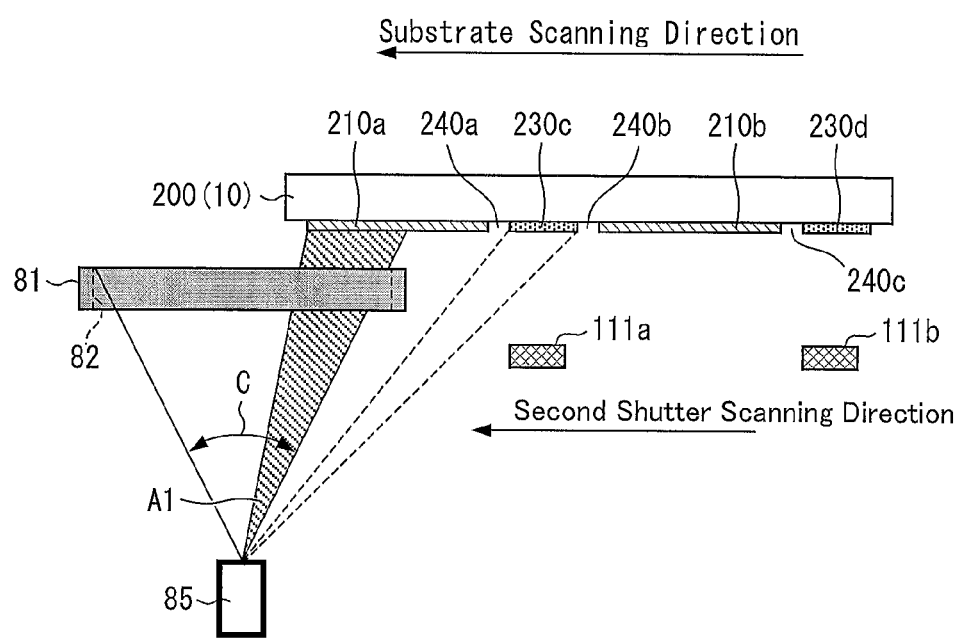

FIG. 25 is a diagram illustrating an escape period for a second shutter in accordance with Embodiment 2.

Figure 26:
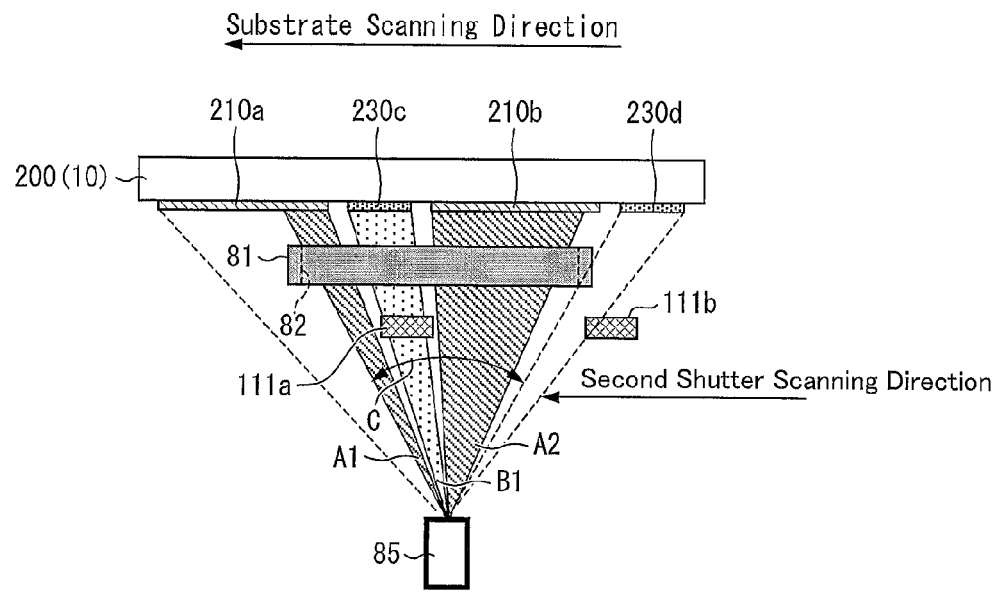

FIG. 26 is a diagram illustrating a control period 1 for a second shutter in accordance with Embodiment 2.

Figure 27:
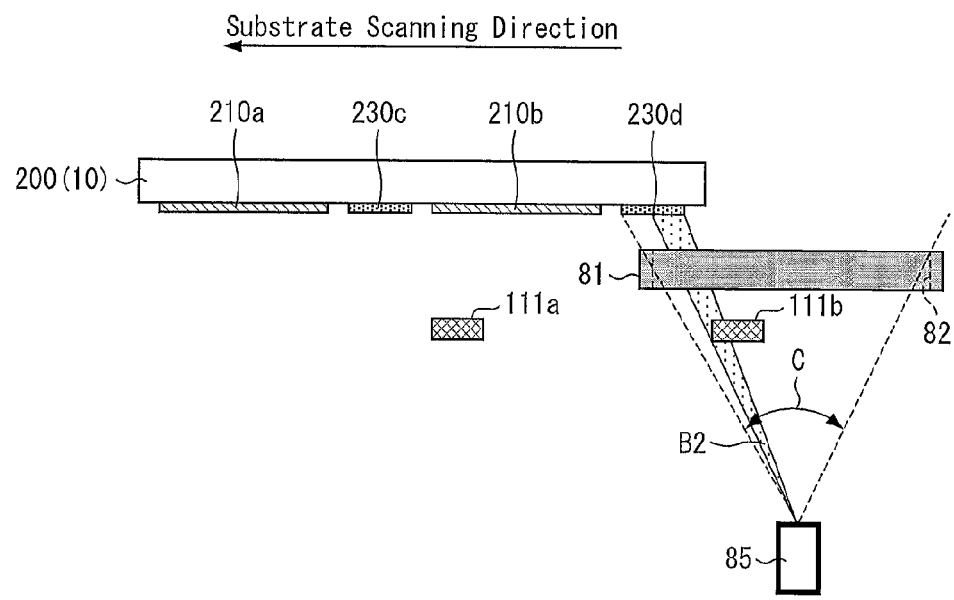

FIG. 27 is a diagram illustrating a control period 2 for a second shutter in accordance with Embodiment 2.

Figure 28:
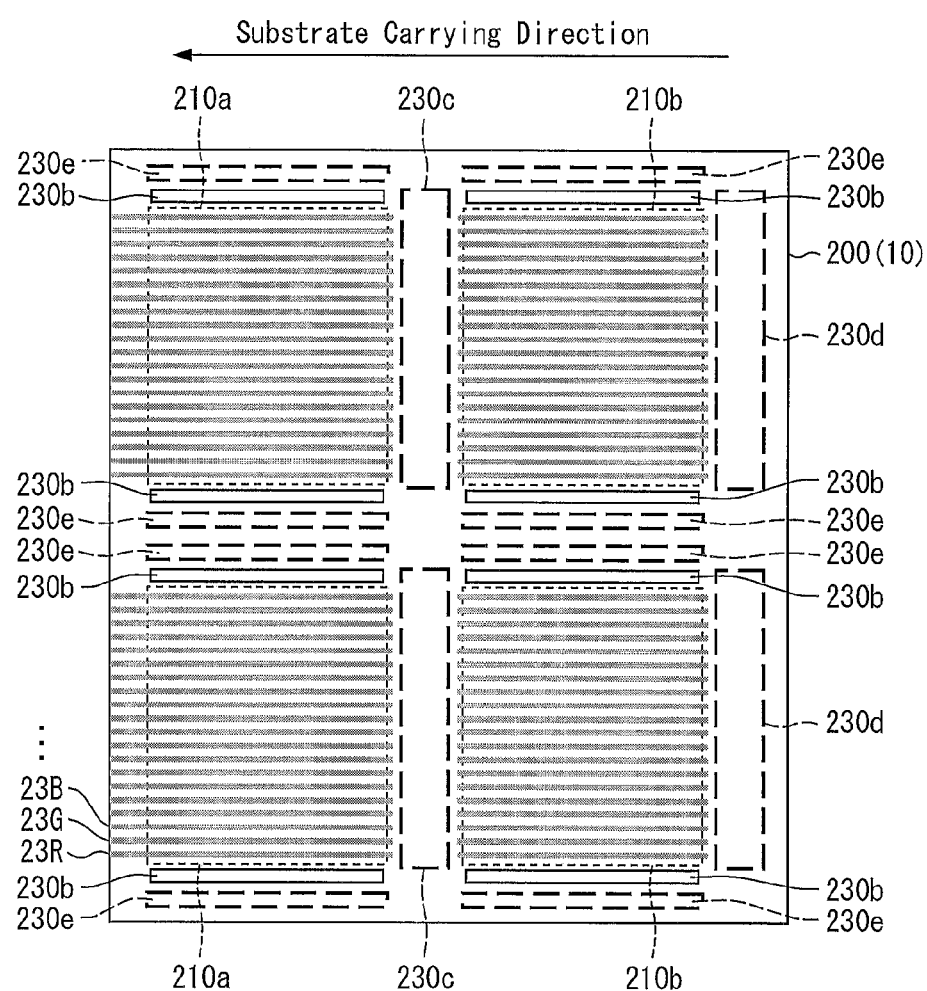

FIG. 28 is a plan view illustrating luminescent layers formed by a vapor deposition method of Embodiment 2.

Figure 29:
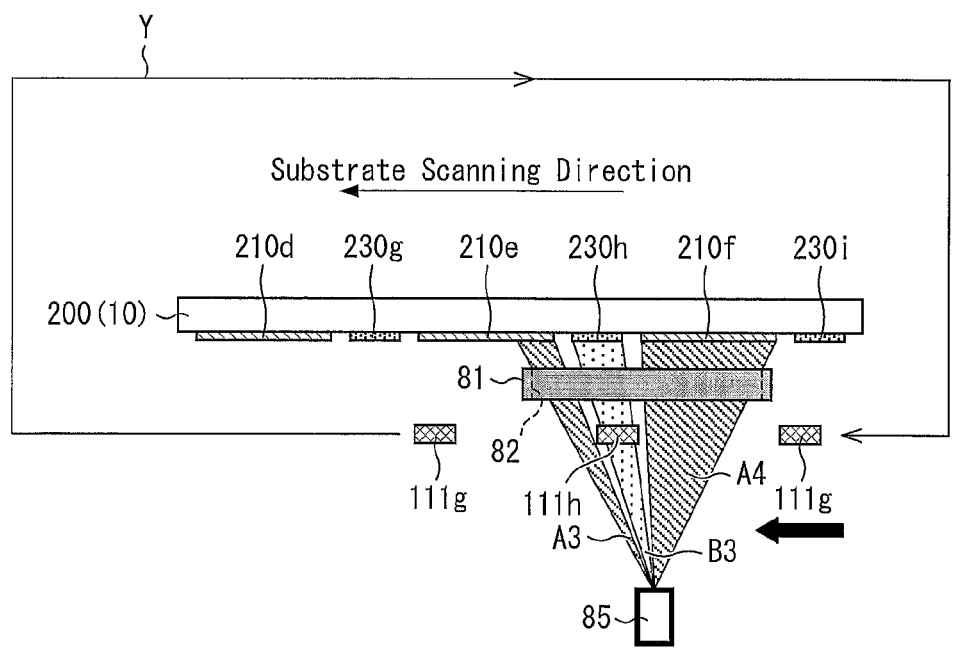

FIG. 29 is a side view illustrating a method for scanning a second shutter in a vapor deposition method of Embodiment 3.

Figure 30:
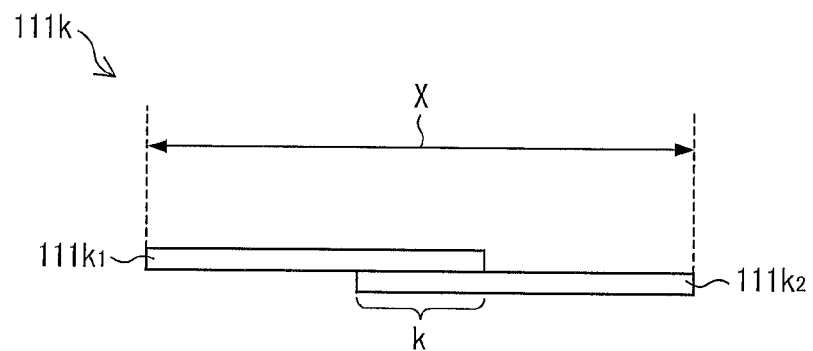

FIG. 30 is a side view illustrating a configuration of a second shutter for use in a vapor deposition method of Embodiment 4.

Figure 31:
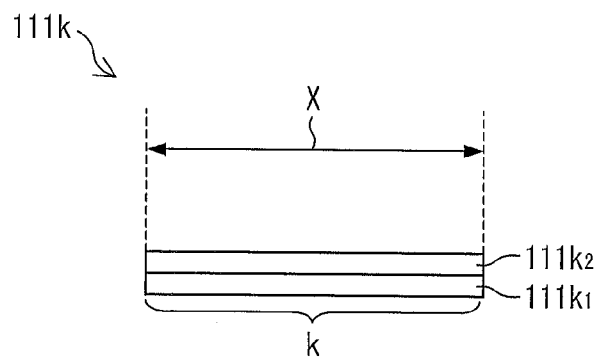

FIG. 31 is a side view illustrating a state in which a second shutter for use in Embodiment 4 has its minimum length.

Figure 32:
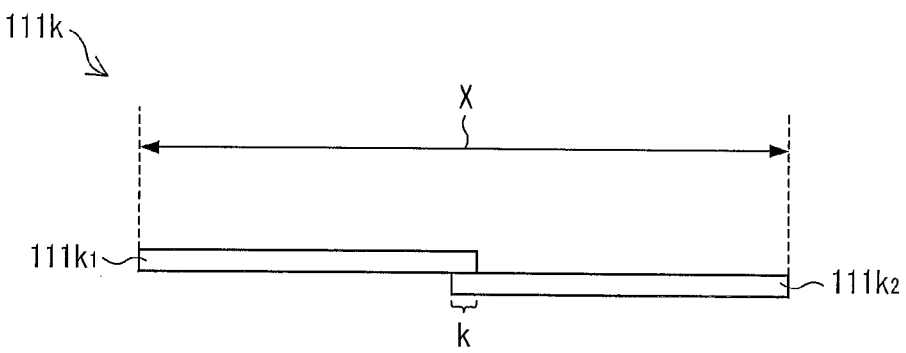

FIG. 32 is a side view illustrating a state in which a second shutter for use in Embodiment 4 has its maximum length.

Figure 33:
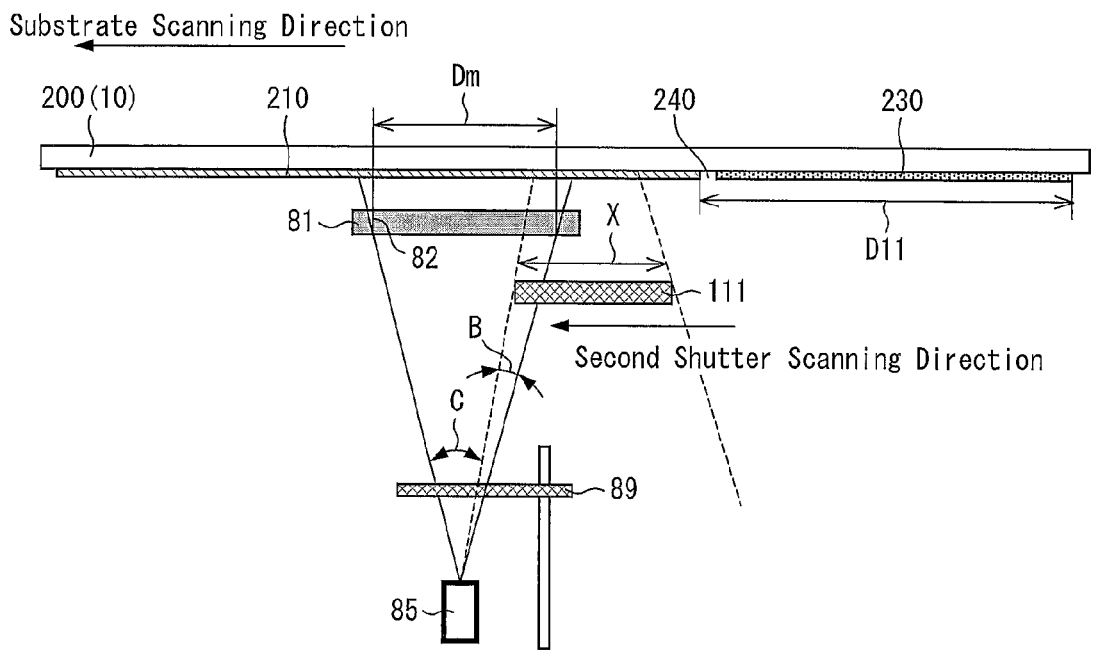

FIG. 33 is a side view illustrating a method for scanning a second shutter in a vapor deposition method of Embodiment 5.

Figure 34:
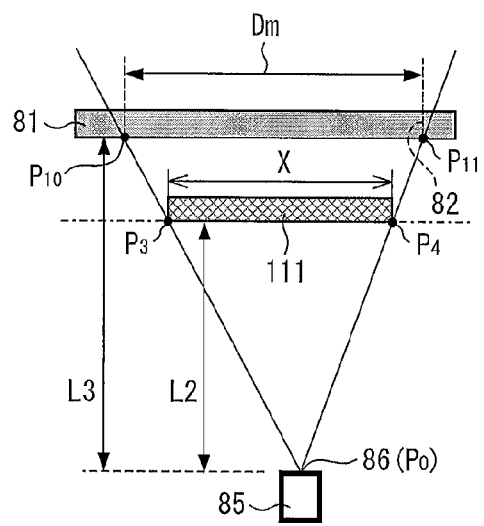

FIG. 34 is a diagram illustrating a method for determining the length of a second shutter in accordance with Embodiment 5.

Figure 35:
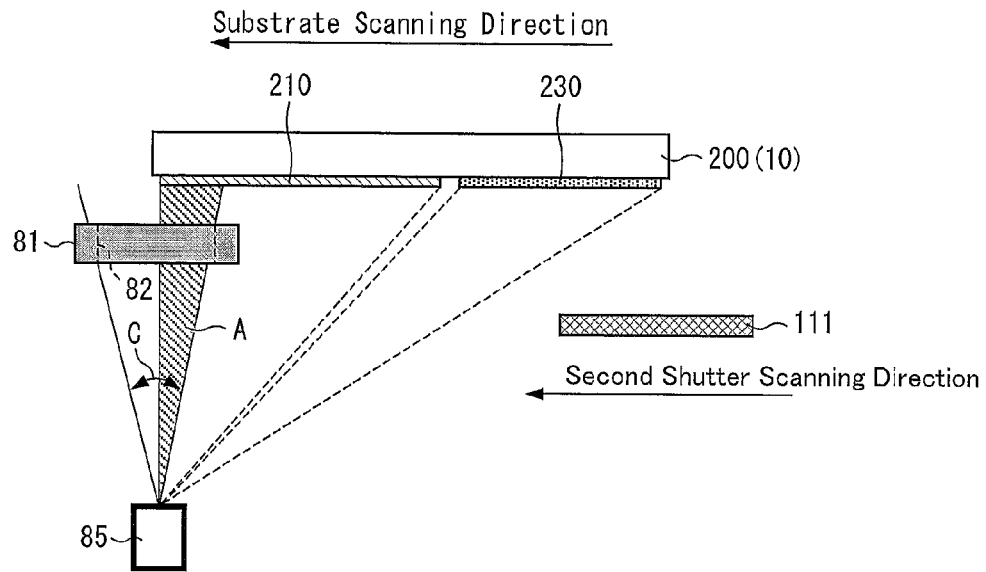

FIG. 35 is a diagram illustrating an escape period for a second shutter in accordance with Embodiment 5.

Figure 36:
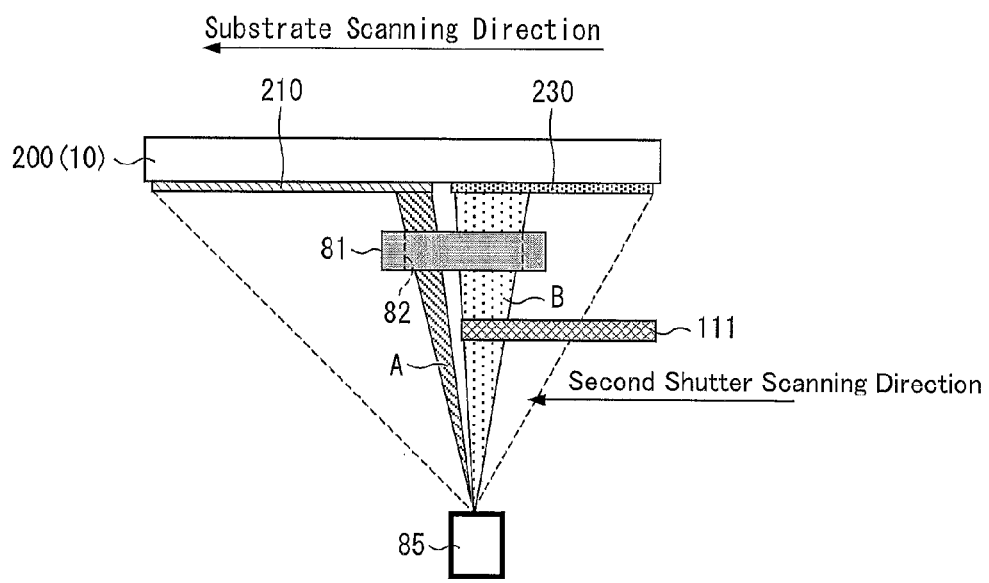

FIG. 36 is a diagram illustrating a control period 1 for a second shutter in accordance with Embodiment 5.

Figure 37:
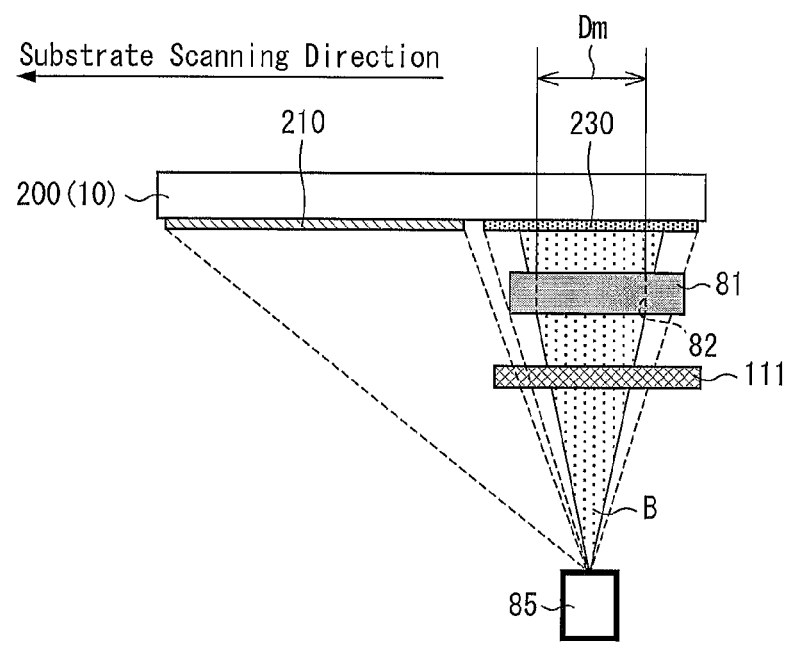

FIG. 37 is a diagram illustrating a control period 2 for a second shutter in accordance with Embodiment 5.

DESCRIPTION OF EMBODIMENTS

Embodiments of the present invention are described below
[Embodiment 1]

An embodiment of the present invention is described below with reference to FIGS. 1 through 22.

The present embodiment describes, as an example vapor deposition method involving a vapor deposition device of the present embodiment, a method for producing an organic EL display device that (i) is of a bottom emission type, that is, extracts light from a TFT substrate side, and that (ii) carries out an RGB full color display.

The description first deals with the overall configuration of the organic EL display device.

FIG. 6 is a cross-sectional view schematically illustrating a configuration of the organic EL display device that carries out an RGB full color display. FIG. 7 is a plan view illustrating an arrangement of pixels included in the organic EL display device illustrated in FIG. 6. FIG. 8 is a cross-sectional view, taken long line A-A in FIG. 7, of a TFT substrate included in the organic EL display device illustrated in FIG. 7.

As illustrated in FIG. 6, the organic EL display device 1 produced in the present embodiment includes: a TFT substrate 10 including TFTs 12 (see FIG. 8); an organic EL element 20 provided on the TFT substrate 10 and connected to the TFTs 12; an adhesive layer 30; and a sealing substrate 40 arranged in that order.

The organic EL element 20, as illustrated in FIG. 6, is contained between the TFT substrate 10 and the sealing substrate 40 by combining the TFT substrate 10, on which the organic EL element 20 is provided, to the sealing substrate 40 with use of the adhesive layer 30.

The organic EL display device 1, in which the organic EL element 20 is contained between the TFT substrate 10 and the sealing substrate 40 as described above, prevents infiltration of oxygen, moisture and the like present outside into the organic EL element 20.

As illustrated in FIG. 8, the TFT substrate 10 includes, as a supporting substrate, a transparent insulating substrate 11 such as a glass substrate. The insulating substrate 11 is, as illustrated in FIG. 7, provided with a plurality of wires 14 including (i) a plurality of gate lines laid in the horizontal direction and (ii) a plurality of signal lines laid in the vertical direction and intersecting with the gate lines. The gate lines are connected to a gate line driving circuit (not shown in the drawings) that drives the gate lines, whereas the signal lines are connected to a signal line driving circuit (not shown in the drawings) that drives the signal lines.

The organic EL display device 1 is a full-color, active matrix organic EL display device. The organic EL display device 1 includes, on the insulating substrate 11 and in regions defined by the wires 14, sub-pixels 2R, 2G, and 2B arranged in a matrix which include organic EL elements 20 of red (R), green (G), and blue (B), respectively.

In other words, the regions defined by the wires 14 each (i) correspond to a single sub-pixel (dot) and (ii) provide a luminescent region of R, G, or B for each sub-pixel.

A pixel 2 (that is, a single pixel) includes three sub-pixels: a red sub-pixel 2R transmitting red light; a green sub-pixel 2G transmitting green light; and a blue sub-pixel 2B transmitting blue light.

The sub-pixels 2R, 2G, and 2B include, as luminescent regions of the respective colors which luminescent regions carry out light emission of the respective sub-pixels 2R, 2G, and 2B, openings 15R, 15G, and 15B that are covered respectively by stripe-shaped luminescent layers 23R, 23G, and 23B of the respective colors.

The luminescent layers 23R, 23G, and 23B are each formed in a pattern by vapor deposition. The openings 15R, 15G, and 15B are described below in detail.

The sub-pixels 2R, 2G, and 2B include respective TFTs 12 each connected to a first electrode 21 of the organic EL element 20. The sub-pixels 2R, 2G, and 2B each have an emission intensity that is determined by scan through the wires 14 and selection of the TFTs 12. As described above, the organic EL display device 1 carries out an image display by selectively causing the organic EL element 20 to emit, by use of the TFTs 12, light with desired luminance.

The following describes in detail respective configurations of the TFT substrate 10 and the organic EL element 20 both included in the organic EL display device 1.

The description below first deals with the TFT substrate 10.

The TFT substrate 10, as illustrated in FIG. 8, includes on a transparent insulating substrate 11 such as a glass substrate: TFTs 12 (switching elements); an interlayer film 13 (interlayer insulating film; planarizing film); wires 14; and an edge cover 15, formed in that order.

The insulating substrate 11 is provided thereon with (i) wires 14 and (ii) TFTs 12 corresponding respectively to the sub-pixels 2R, 2G, and 2B. Since the configuration of a TFT has conventionally been well known, the individual layers of a TFT 12 are not illustrated in the drawings or described herein.

The interlayer film 13 is provided on the insulating substrate 11 throughout the entire region of the insulating substrate 11 to cover the TFTs 12.

There are provided on the interlayer film 13 a first electrode 21 of the organic EL element 20.

The interlayer film 13 has contact holes 13a for electrically connecting the first electrode 21 of the organic EL element 20 to the TFTs 12. This electrically connects the TFTs 12 to the organic EL element 20 via the contact holes 13a.

The edge cover 15 is an insulating layer for preventing the first electrode 21 and a second electrode 26 of the organic EL element 20 from short-circuiting with each other due to, for example, (i) a reduced thickness of the organic EL layer in an edge section of the pattern of the first electrode 21 or (ii) an electric field concentration.

The edge cover 15 is so formed on the interlayer film 13 as to cover edge sections of the pattern of the first electrode 21.

The edge cover 15 has openings 15R, 15G, and 15B for the sub-pixels 2R, 2G, and 2B, respectively. The openings 15R, 15G, and 15B of the edge cover 15 define the respective luminescent regions of the sub-pixels 2R, 2G, and 2B.

The sub-pixels 2R, 2G, and 2B are, in other words, isolated from one another by the insulating edge cover 15. The edge cover 15 thus functions as an element isolation film as well.

The description below now deals with the organic EL element 20.

The organic EL element 20 is a light-emitting element capable of high-luminance light emission based on low-voltage direct-current driving, and includes: a first electrode 21; an organic EL layer; and a second electrode 26, provided on top of one another in that order.

The first electrode 21 is a layer having the function of injecting (supplying) positive holes into the organic EL layer. The first electrode 21 is, as described above, connected to the TFTs 12 via the contact holes 13a.

The organic EL layer provided between the first electrode 21 and the second electrode 26 includes, as illustrated in FIG. 8: a hole injection layer/hole transfer layer 22; luminescent layers 23R, 23G, and 23B; an electron transfer layer 24; and an electron injection layer 25, formed in that order from the first electrode 21 side.

The above stack order intends to use (i) the first electrode 21 as an anode and (ii) the second electrode 26 as a cathode. The stack order of the organic EL layer is reversed in the case where the first electrode 21 serves as a cathode and the second electrode 26 serves as an anode.

The hole injection layer has the function of increasing efficiency in injecting positive holes into the luminescent layers 23R, 23G, and 23B. The hole transfer layer has the function of increasing efficiency in transferring positive holes to the luminescent layers 23R, 23G, and 23B. The hole injection layer/hole transfer layer 22 is so formed uniformly throughout the entire display region of the TFT substrate 10 as to cover the first electrode 21 and the edge cover 15.

The present embodiment describes an example case involving, as the hole injection layer and the hole transfer layer, a hole injection layer/hole transfer layer 22 that integrally combines a hole injection layer with a hole transfer layer as described above. The present embodiment is, however, not limited to such an arrangement: The hole injection layer and the hole transfer layer may be provided as separate layers independent of each other.

There are provided on the hole injection layer/hole transfer layer 22 the luminescent layers 23R, 23G, and 23B so formed in correspondence with the respective sub-pixels 2R, 2G, and 2B as to cover the respective openings 15R, 15G, and 15B of the edge cover 15.

The luminescent layers 23R, 23G, and 23B are each a layer that has the function of emitting light by recombining (i) holes (positive holes) injected from the first electrode 21 side with (ii) electrons injected from the second electrode 26 side. The luminescent layers 23R, 23G, and 23B are each made of a material with high luminous efficiency, such as a low-molecular fluorescent dye and a metal complex.

The electron transfer layer 24 is a layer that has the function of increasing efficiency in transferring electrons from the second electrode 26 to the luminescent layers 23R, 23G, and 23B. The electron injection layer 25 is a layer that has the function of increasing efficiency in injecting electrons from the second electrode 26 into the luminescent layers 23R, 23G, and 23B.

The electron transfer layer 24 is so provided on the luminescent layers 23R, 23G, and 23B and the hole injection layer/hole transfer layer 22 uniformly throughout the entire display region of the TFT substrate 10 as to cover the luminescent layers 23R, 23G, and 23B and the hole injection layer/hole transfer layer 22. The electron injection layer 25 is so provided on the electron transfer layer 24 uniformly throughout the entire display region of the TFT substrate 10 as to cover the electron transfer layer 24.

The electron transfer layer 24 and the electron injection layer 25 may be provided either (i) as separate layers independent of each other as described above or (ii) integrally with each other. In other words, the organic EL display device 1 may include an electron transfer layer/electron injection layer instead of the electron transfer layer 24 and the electron injection layer 25.

The second electrode 26 is a layer having the function of injecting electrons into the organic EL layer including the above organic layers. The second electrode 26 is so provided on the electron injection layer 25 uniformly throughout the entire display region of the TFT substrate 10 as to cover the electron injection layer 25.

The organic layers other than the luminescent layers 23R, 23G, and 23B are not essential for the organic EL layer, and may thus be included as appropriate in accordance with a required property of the organic EL element 20. The organic EL layer may further include a carrier blocking layer according to need. The organic EL layer can, for example, additionally include, as a carrier blocking layer, a hole blocking layer between the luminescent layers 23R, 23G, and 23B and the electron transfer layer 24 to prevent positive holes from transferring from the luminescent layers 23R, 23G, and 23B to the electron transfer layer 24 and thus to improve luminous efficiency.

The organic EL element 20 can have, for example, any of the layered structures (1) through (8) below.

(1) first electrode/luminescent layer/second electrode (2) first electrode/hole transfer layer/luminescent layer/electron transfer layer/second electrode (3) first electrode/hole transfer layer/luminescent layer/hole blocking layer (carrier blocking layer)/electron transfer layer/second electrode (4) first electrode/hole transfer layer/luminescent layer/hole blocking layer/electron transfer layer/electron injection layer/second electrode (5) first electrode/hole injection layer/hole transfer layer/luminescent layer/electron transfer layer/electron injection layer/second electrode (6) first electrode/hole injection layer/hole transfer layer/luminescent layer/hole blocking layer/electron transfer layer/second electrode (7) first electrode/hole injection layer/hole transfer layer/luminescent layer/hole blocking layer/electron transfer layer/electron injection layer/second electrode (8) first electrode/hole injection layer/hole transfer layer/electron blocking layer (carrier blocking layer)/luminescent layer/hole blocking layer/electron transfer layer/electron injection layer/second electrode As described above, the hole injection layer and the hole transfer layer, for example, may be integrated with each other. The electron transfer layer and the electron injection layer may be integrated with each other.

The structure of the organic EL element 20 is not limited to the above example layered structure, and may be a desired layered structure according to a required property of the organic EL element 20 as described above.

The description below deals with a method for producing the organic EL display device 1.

FIG. 9 is a flowchart indicating successive steps for producing the organic EL display device 1.

As illustrated in FIG. 9, the method of the present embodiment for producing the organic EL display device 1 includes steps such as a TFT substrate/first electrode preparing step (S1), a hole injection layer/hole transfer layer vapor deposition step (S2), a luminescent layer vapor deposition step (S3), an electron transfer layer vapor deposition step (S4), an electron injection layer vapor deposition step (S5), a second electrode vapor deposition step (S6), and a sealing step (S7).

The following describes, with reference to the flowchart illustrated in FIG. 9, the individual steps described above with reference to FIGS. 6 and 8.

Note, however, that the dimensions, materials, shapes and the like of the respective constituent elements described in the present embodiment merely serve as an embodiment, and that the scope of the present invention should not be construed limitedly on the grounds of such aspects of the constituent elements.

The stack order described in the present embodiment, as mentioned above, intends to use (i) the first electrode 21 as an anode and (ii) the second electrode 26 as a cathode. In the converse case where the first electrode 21 serves as a cathode and the second electrode 26 serves as an anode, the stack order of the organic EL layer is reversed, and the respective materials of the first electrode 21 and the second electrode 26 are switched similarly.

First, as illustrated in FIG. 8, the method of the present embodiment (i) applies a photosensitive resin onto an insulating substrate 11 that is made of a material such as glass and that includes, for example, TFTs 12 and wires 14 each formed by a publicly known technique, and (ii) carries out patterning with respect to the photosensitive resin by photolithography. This forms an interlayer film 13 on the insulating substrate 11.

The insulating substrate 11 is, for example, a glass or plastic substrate having (i) a thickness of 0.7 to 1.1 mm, (ii) a length (longitudinal length) of 400 to 500 mm along a y axis direction, and (iii) a length (lateral length) of 300 to 400 mm along an x axis direction. The insulating substrate 11 of the present embodiment was a glass substrate.

The interlayer film 13 can be made of, for example, an acrylic resin or a polyimide resin. The acrylic resin is, for example, a product in the Optomer series available from JSR Corporation. The polyimide resin is, for example, a product in the Photoneece series available from Toray Industries, Inc. Note that since a typical polyimide resin is not transparent but colored, the interlayer film 13 is more suitably made of a transparency resin such as an acrylic resin in the case where an organic EL display device of the bottom emission type is produced as the organic EL display device 1 as illustrated in FIG. 8.

The interlayer film 13 is simply required to have a film thickness that can compensate for the difference in level created by the TFTs 12. The film thickness is thus not particularly limited. The film thickness was, for example, approximately 2 μm in the present embodiment.

The method of the present embodiment next forms, in the interlayer film 13, contact holes 13a for electrically connecting the first electrode 21 to the TFTs 12.

The method then forms, as a conductive film (electrode film), a film such as an ITO (indium tin oxide) film by a method such as a sputtering method so that the film has a thickness of 100 nm.

The method next applies a photoresist onto the ITO film, carries out patterning with respect to the photoresist by photolithography, and then carries out etching with respect to the ITO film with use of ferric chloride as an etchant. The method then strips the photoresist with use of a resist exfoliative solution, and further washes the substrate. This forms, on the interlayer film 13, a first electrode 21 in a matrix.

The conductive film material for the first electrode 21 is, for example, (i) a transparent conductive material such as ITO, IZO (indium zinc oxide), and gallium-added zinc oxide (GZO) or (ii) a metal material such as gold (Au), nickel (Ni), and platinum (Pt).

The above conductive film can be formed by, instead of the sputtering method, a method such as a vacuum vapor deposition method, a chemical vapor deposition (CVD) method, a plasma CVD method, and a printing method.

The thickness of the first electrode 21 is not particularly limited. The first electrode 21 can have a thickness of, for example, 100 nm as mentioned above.

The method next forms a pattern of an edge cover 15, as with the interlayer film 13, to have a film thickness of, for example, approximately 1 μm. The edge cover 15 can be made of an insulating material similar to that for the interlayer film 13.

The step described above prepares the TFT substrate 10 and the first electrode 21 (S1).

The method of the present embodiment next carries out, with respect to the TFT substrate 10 prepared through the above step, (i) a bake under a reduced pressure for dehydration and (ii) an oxygen plasma treatment for surface washing of the first electrode 21.

Then, the method carries out vapor deposition of a hole injection layer and a hole transfer layer (in the present embodiment, a hole injection layer/hole transfer layer 22) on the TFT substrate 10 throughout its entire display region with use of a conventional vapor deposition device (S2).

Specifically, the method (i) carries out an alignment adjustment, relative to the TFT substrate 10, of an open mask having an opening corresponding to the entire display region and (ii) closely combines the open mask to the TFT substrate 10. The method then, while rotating the TFT substrate 10 and the open mask together, carries out, through the opening of the open mask and uniformly throughout the entire display region, vapor deposition of vapor deposition particles scattered from a vapor deposition source.

The above vapor deposition carried out throughout the entire display region refers to vapor deposition carried out unintermittently over sub-pixels having different colors and located adjacent to one another.

The hole injection layer and the hole transfer layer are each made of a material such as (i) benzine, styryl amine, triphenylamine, porphyrin, triazole, imidazole, oxadiazole, polyarylalkane, phenylenediamine, arylamine, oxazole, anthracene, fluorenone, hydrazone, stilbene, triphenylene, azatriphenylene, or a derivative of any of the above, (ii) a polysilane compound, (iii) a vinylcarbazole compound, (iv) and a monomer, an oligomer, or a polymer of a heterocyclic conjugated system, such as a thiophene compound and an aniline compound.

The hole injection layer and the hole transfer layer may be either integrated with each other as described above or formed as separate layers independent of each other. The hole injection layer and the hole transfer layer each have a film thickness of, for example, 10 to 100 nm.

The present embodiment used, as the hole injection layer and the hole transfer layer, a hole injection layer/hole transfer layer 22 that was made of 4,4'-bis[N-(1-naphthyl)-N-phenylamino]biphenyl($\alpha$-NPD) and that had a film thickness of 30 nm.

The method of the present embodiment next carries out a discriminative application formation (pattern formation) of luminescent layers 23R, 23G, and 23B on the hole injection layer/hole transfer layer 22 in correspondence with respective sub-pixels 2R, 2G, and 2B so that the luminescent layers 23R, 23G, and 23B cover respective openings 15R, 15G, and 15B of the edge cover 15 (S3).

As described above, the luminescent layers 23R, 23G, and 23B are each made of a material with high luminous efficiency, such as a low-molecular fluorescent dye and a metal complex.

The luminescent layers 23R, 23G, and 23B are each made of a material such as (i) anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, or a derivative of any of the above, (ii) a tris(8-hydroxyquinolinate) aluminum complex, (iii) a bis(benzohydroxyquinolinate) beryllium complex, (iv) a tri (dibenzoylmethyl)phenanthroline europium complex, (v) and ditoluoyl vinyl biphenyl.

The luminescent layers 23R, 23G, and 23B each have a film thickness of, for example, 10 to 100 nm.

The vapor deposition method and the vapor deposition device of the present embodiment are each particularly suitably used for a discriminative application formation (pattern formation) of such luminescent layers 23R, 23G, and 23B.

A description below deals in detail with a discriminative application formation of the luminescent layers 23R, 23G, and 23B which discriminative application formation involves the vapor deposition method and the vapor deposition device of the present embodiment.

The method of the present embodiment next carries out, in a manner similar to that described for the above hole injection layer/hole transfer layer vapor deposition step (S2), vapor deposition of an electron transfer layer 24 throughout the entire display region of the TFT substrate 10 so that the electron transfer layer 24 covers the hole injection layer/hole transfer layer 22 and the luminescent layers 23R, 23G, and 23B (S4).

The method then carries out, in a manner similar to that described for the above hole injection layer/hole transfer layer vapor deposition step (S2), vapor deposition of an electron injection layer 25 throughout the entire display region of the TFT substrate 10 so that the electron injection layer 25 covers the electron transfer layer 24 (S5).

The electron transfer layer 24 and the electron injection layer 25 are each made of a material such as a tris (8-hydroxyquinolinate) aluminum complex, an oxadiazole derivative, a triazole derivative, a phenylquinoxaline derivative, and a silole derivative.

Specific examples of the material include (i) Alq (tris(8-hydroxy quinoline)aluminum), anthracene, naphthalene, phenanthrene, pyrene, anthracene, perylene, butadiene, coumarin, acridine, stilbene, 1,10-phenanthroline, and a derivative or metal complex of any of the above, and (ii) LiF.

As mentioned above, the electron transfer layer 24 and the electron injection layer 25 may be either integrated with each other or formed as separate layers independent of each other. The electron transfer layer 24 and the electron injection layer 25 each have a film thickness of, for example, 1 to 100 nm. The respective film thicknesses of the electron transfer layer 24 and the electron injection layer 25 add up to, for example, 20 to 200 nm.

In the present embodiment, (i) the electron transfer layer 24 was made of Alq, whereas the electron injection layer 25 was made of LiF, and (ii) the electron transfer layer 24 had a film thickness of 30 nm, whereas the electron injection layer 25 had a film thickness of 1 nm.

The method of the present embodiment next carries out, in a manner similar to that described for the above hole injection layer/hole transfer layer vapor deposition step (S2), vapor deposition of a second electrode 26 throughout the entire display region of the TFT substrate 10 so that the second electrode 26 covers the electron injection layer 25 (S6).

The second electrode 26 is suitably made of a material (electrode material) such as a metal with a small work function. Examples of such an electrode material include a magnesium alloy (for example, MgAg), an aluminum alloy (for example, AlLi, AlCa, or AlMg) and calcium metal. The second electrode 26 has a thickness of, for example, 50 to 100 nm.

In the present embodiment, the second electrode 26 was made of aluminum and has a film thickness of 50 nm. The operation described above forms, on the TFT substrate 10, an organic EL element 20 including the organic EL layer, the first electrode 21, and the second electrode 26 described above.

The method of the present embodiment then combined (i) the TFT substrate 10, on which the organic EL element 20 is provided, to (ii) a sealing substrate 40 with use of an adhesive layer 30 as illustrated in FIG. 6 so that the organic EL element 20 was contained.

The sealing substrate 40 is, for example, an insulating substrate such as a glass substrate and a plastic substrate and 0.4 to 1.1 mm in thickness. The sealing substrate 40 of the present embodiment was a glass substrate.

The longitudinal and lateral lengths of the sealing substrate 40 may each be adjusted as appropriate in accordance with the size of a target organic EL display device 1. The sealing substrate 40 may be an insulating substrate substantially equal in size to the insulating substrate 11 of the TFT substrate 10, in which case a combination of the sealing substrate 40, the TFT substrate 10, and the organic EL element 20 contained therebetween is divided in accordance with the size of a target organic EL display device 1.

The method for sealing the organic EL element 20 is not limited to the method described above. Examples of other sealing methods include (i) a method that uses a centrally depressed glass substrate as the sealing substrate 40 and that the combination of the sealing substrate 40 and the TFT substrate 10 is sealed along the edge in a frame shape with use of, for example, a sealing resin or fritted glass, and (ii) a method that fills a space between the TFT substrate 10 and the sealing substrate 40 with a resin. The method for producing the organic EL display device 1 does not depend on the above sealing method, and can employ any of various sealing methods.

The second electrode 26 may be provided thereon with a protective film (not shown) that covers the second electrode 26 and that prevents infiltration of oxygen, moisture and the like present outside into the organic EL element 20.

The protective film is made of an electrically insulating or conductive material such as silicon nitride and silicon oxide. The protective film has a thickness of, for example, 100 to 1000 nm.

Through the above steps, the organic EL display device 1 is finally produced.

The organic EL display device 1, upon receipt of a signal through a wire 14, turns on a TFT 12 and thus allows (i) positive holes to be injected from the first electrode 21 into the organic EL layer and further (ii) electrons to be injected from the second electrode 26 into the organic EL layer. This causes the positive holes and the electrons to recombine with each other inside the luminescent layers 23R, 23G, and 23B. The positive holes and the electrons thus recombined are emitted in the form of light when becoming inactive.

In the above organic EL display device 1, controlling respective light emission luminances of the sub-pixels 2R, 2G, and 2B allows a predetermined image to be displayed.

The following describes an arrangement of a vapor deposition device of the present embodiment.

Figure 1:
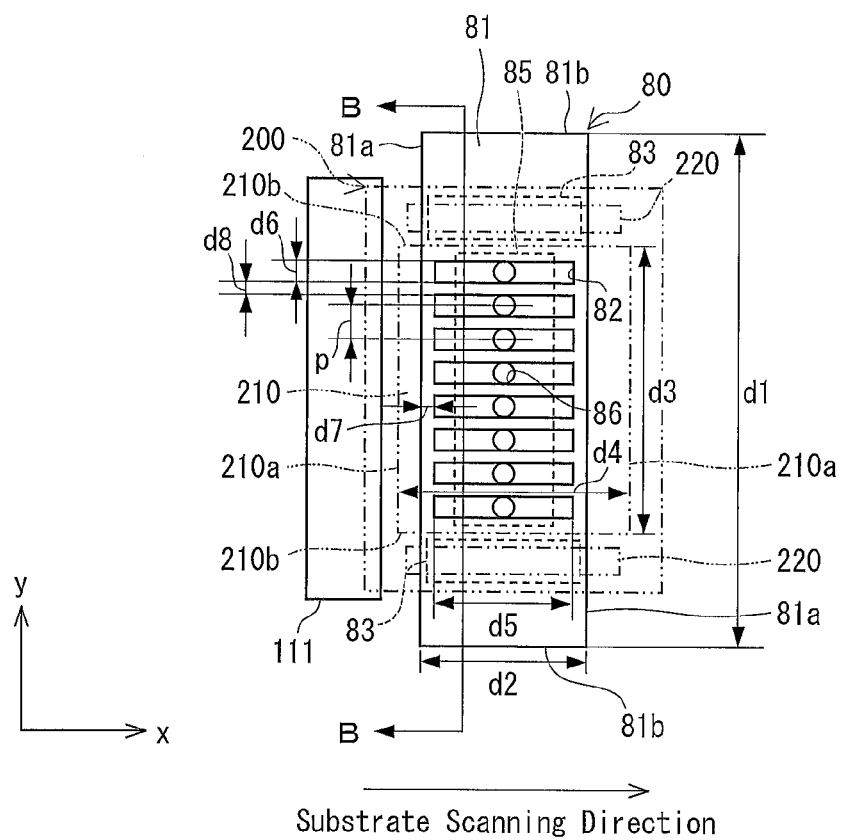
FIG. 1 is a plan view illustrating a film formation substrate and a mask unit inside a vacuum chamber of a vapor deposition device according to one embodiment of the present invention, the plan view being taken from a back surface side of the film formation substrate.
Figure 2:
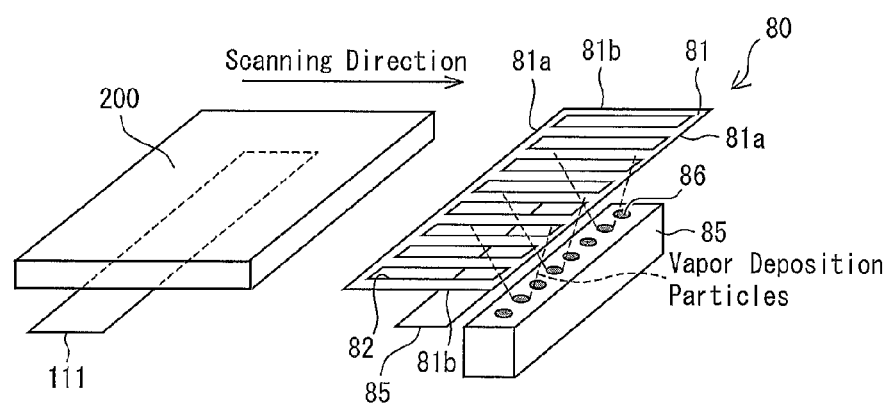
FIG. 2 is a bird's eye view illustrating main constituent elements inside the vacuum chamber of the vapor deposition device according to one embodiment of the present invention.
Figure 3:
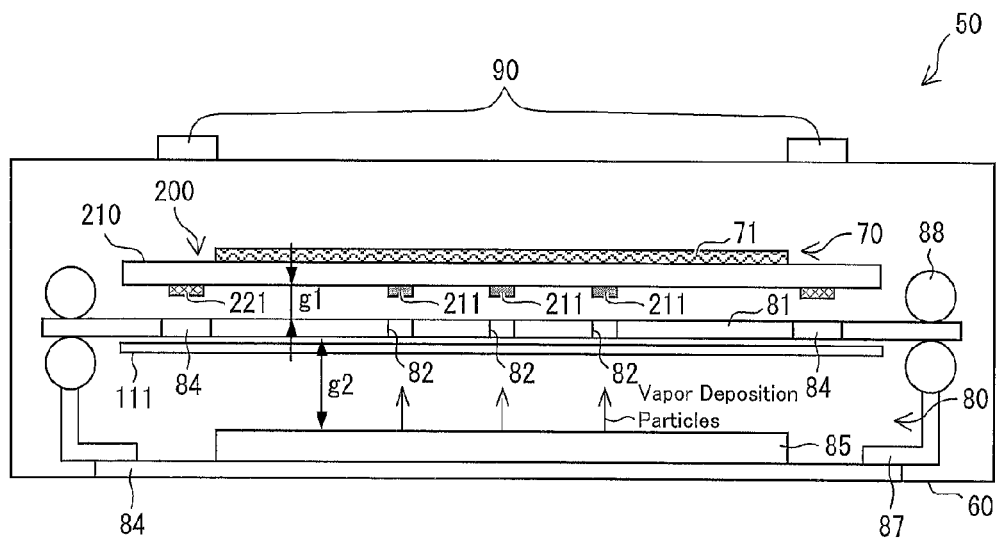
FIG. 3 is a cross-sectional view schematically illustrating a configuration of a main part of the vapor deposition device according to one embodiment of the present invention.
Figure 4:
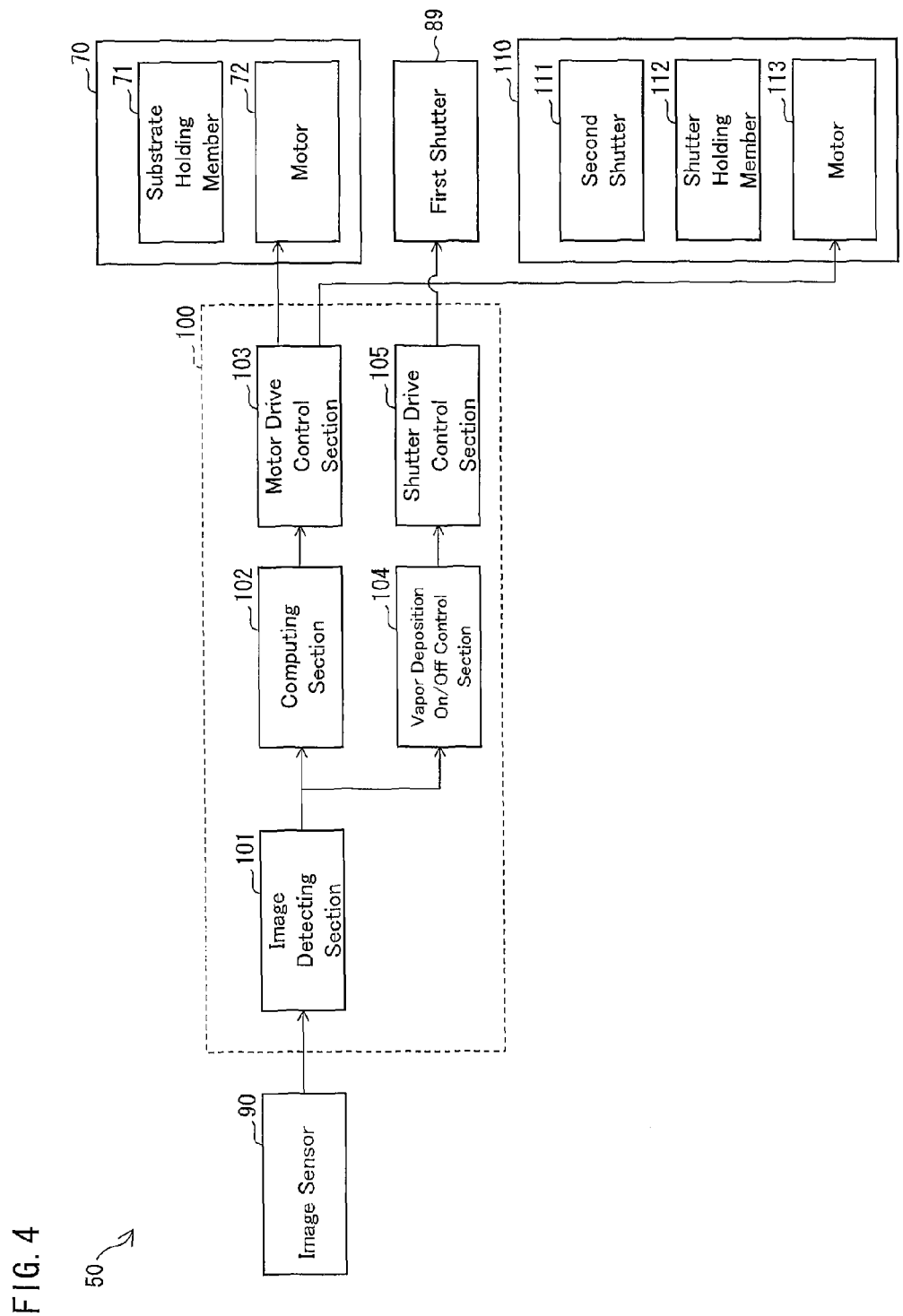
FIG. 4 is a block diagram partially illustrating a configuration of the vapor deposition device according to one embodiment of the present invention.

FIG. 1 is a plan view of a film formation substrate and a mask unit both inside a vacuum chamber of the vapor deposition device of the present embodiment, the plan view being taken from a back surface side of the film formation substrate (that is, the side opposite to the vapor deposition surface). For convenience of illustration, FIG. 1 uses a chain double-dashed line to represent the film formation substrate. FIG. 2 is a bird's eye view of main constituent elements inside the vacuum chamber of the vapor deposition device of the present embodiment. FIG. 3 is a cross-sectional view schematically illustrating a configuration of a main part of the vapor deposition device of the present embodiment. FIG. 3 illustrates a cross section of the vapor deposition device, the cross section being taken along line B-B of FIG. 1. FIG. 4 is a block diagram illustrating a part of a configuration of the vapor deposition device of the present embodiment.

The vapor deposition device 50 of the present embodiment, as illustrated in FIG. 3, includes: a vacuum chamber 60 (film growing chamber); a substrate moving mechanism 70 (substrate moving means; moving means); a mask unit 80; image sensors 90; a control circuit 100 (see FIG. 4); and a shutter moving mechanism 110 (see FIG. 4).

As illustrated in FIG. 3, the vacuum chamber 60 contains the substrate moving mechanism 70, the mask unit 80, and the shutter moving mechanism 110 (see FIG. 4).

The vacuum chamber 60 is provided with a vacuum pump (not shown) for vacuum-pumping the vacuum chamber 60 via an exhaust port (not shown) of the vacuum chamber 60 to keep a vacuum in the vacuum chamber 60 during vapor deposition.

The substrate moving mechanism 70 includes, for example: a substrate holding member 71 (substrate holding means) for holding a film formation substrate 200 (for example, a TFT substrate 10); and a motor 72 (see FIG. 4).

The substrate moving mechanism 70 causes (i) the substrate holding member 71 to hold the film formation substrate 200 and (ii) a below-described motor drive control section 103 (see FIG. 4) to drive the motor 72 so as to hold the film formation substrate 200 and move it in the horizontal direction. The substrate moving mechanism 70 may be provided to be capable of moving the film formation substrate 200 either (i) in both the x axis direction (for example, a substrate scanning direction) and the y axis direction y axis direction (for example, the horizontal direction orthogonal to the x axis) or (ii) in one of the x axis direction and the y axis direction.

The substrate holding member 71 is an electrostatic chuck. The film formation substrate 200 is, in a state in which bend due to its own weight is absent, so held by the electrostatic chuck as to be separated from a below-described shadow mask 81 of the mask unit 80 by a fixed gap g1 (void; vertical distance).

The gap g1 between the film formation substrate 200 and the shadow mask 81 preferably falls within the range of not less than 50 μm and not more than 3 mm, or is more preferably on the order of 200 μm.

If the gap g1 is smaller than 50 μm, the film formation substrate 200 will likely be come into contact with the shadow mask 81.

If the gap g1 is larger than 3 mm, vapor deposition particles that have passed through openings 82 of the shadow mask 81 are spread widely, which results in a vapor-deposited film 211 being formed to have too large a pattern width. In the case where, for example, the vapor-deposited film 211 is the luminescent layer 23R, the gap g1 being larger than 3 mm may undesirably result in vapor deposition of the material of the luminescent layer 23R through the respective openings 15G and 15B of the adjacent sub-pixels 2G and 2B.

With the gap g1 being approximately 200 μm, (i) there is no risk of the film formation substrate 200 coming into contact with the shadow mask 81, and (ii) the vapor-deposited film 211 can have a sufficiently small pattern width.

The mask unit 80, as illustrated in FIG. 3, includes: a shadow mask 81 (vapor deposition mask; mask); a vapor deposition source 85; a mask holding member 87 (holding means); a mask tension mechanism 88; and a first shutter 89 (see FIG. 4).

The shadow mask 81 is, for example, a metal mask.

The shadow mask 81 is, for instance, so formed as to (i) be smaller in area than a vapor deposition region 210 of the film formation substrate 200 and (ii) have at least one side that is shorter than the width of the vapor deposition region 210 of the film formation substrate 200.

The shadow mask 81 of the present embodiment has a rectangular shape (that is, in the shape of a belt), and is sized as follows: The shadow mask 81 is, as illustrated in FIG. 1, so formed as to have (i) long sides 81a each with a width d1 (that is, the length along the long-side direction [long-axis direction] of the shadow mask 81) that is larger than the width d3 of a side of the vapor deposition region 210 (in the example illustrated in FIG. 1, a long side 210a of the vapor deposition region 210) which side faces the long sides 81a of the shadow mask 81 and (ii) short sides 81b each with a width d2 (that is, the length along the short-side direction [short-axis direction] of the shadow mask 81) that is smaller than the width d4 of a side of the vapor deposition region 210 (in the example illustrated in FIG. 1, a short side 210b of the vapor deposition region 210) which side faces the short sides 81b of the shadow mask 81.

The shadow mask 81, as illustrated in FIGS. 1 and 2, has a plurality of openings 82 (through holes) arranged in a one-dimensional direction and each having the shape of, for example, a belt (that is, in a stripe shape). In the case where, for example, a discriminative application formation of the luminescent layers 23R, 23G, and 23B is carried out with respect to the TFT substrate 10 as a pattern formation of vapor-deposited films 211 (see FIG. 3) on the film formation substrate 200, the openings 82 are formed in correspondence with the size and pitch of columns for each color of the luminescent layers 23R, 23G, and 23B.

The shadow mask 81, as illustrated in FIG. 1, includes, for example, alignment marker sections 83 extending along a scanning direction (substrate scanning direction) of the film formation substrate 200. The alignment marker sections 83 include respective alignment markers 84 (see FIG. 3) for use in an alignment between the film formation substrate 200 and the shadow mask 81.

The alignment marker sections 83 of the present embodiment are, as illustrated in FIG. 1, provided along the short sides 81b (short axis) of the shadow mask 81.

The shadow mask 81, as described above, has (i) long sides 81a each with a width d1 that is larger than the width d3 of a side of the vapor deposition region 210 which side faces the long sides 81a and (ii) short sides 81b each with a width d2 that is smaller than the width d4 of a side of the vapor deposition region 210 which side faces the short sides 81b. This arrangement allows the alignment marker sections 83 to be formed respectively in opposite end sections arranged along the long-side direction (that is, at the opposite short sides 81b and 81b). The above arrangement thus makes it possible to carry out an alignment easily and more precisely.

The film formation substrate 200, as illustrated in FIG. 1, includes alignment marker sections 220 outside the vapor deposition region 210 and along the scanning direction (substrate scanning direction) of the film formation substrate 200. The alignment marker sections 220 include respective alignment markers 221 (see FIG. 3) for use in an alignment between the film formation substrate 200 and the shadow mask 81.

The alignment marker sections 220 of the present embodiment are, as illustrated in FIG. 1, provided along the respective short sides 210b (short axis) of the vapor deposition region 210 of the film formation substrate 200.

The stripe-shaped openings 82 of the present embodiment are provided to (i) extend along the short-side direction of the shadow mask 81, that is, the substrate scanning direction, and to (ii) be arranged next to one another along the long-side direction of the shadow mask 81, that is, a direction that orthogonally crosses the substrate scanning direction.

The vapor deposition source 85 is, for example, a container that contains a vapor deposition material. The vapor deposition source 85 is, as illustrated in FIGS. 1 through 3, (i) placed to face the shadow mask 81 and (ii) separated from the shadow mask 81 by a fixed gap g2 (void), that is, positioned away from the shadow mask 81 by a fixed distance.

The vapor deposition source 85 may be a container that itself contains a vapor deposition material or a container that includes a load-lock pipe.

The vapor deposition source 85 includes, for example, a mechanism for emitting vapor deposition particles upward.

The vapor deposition source 85 has, on a surface facing the shadow mask 81, a plurality of injection holes 86 for emitting (scattering) the vapor deposition material in the form of vapor deposition particles.

The present embodiment is arranged as described above such that (i) the vapor deposition source 85 is provided below the film formation substrate 200 and that (ii) the film formation substrate 200 is held by the substrate holding member 71 in such a state that the vapor deposition region 210 faces downward. Thus, in the present embodiment, the vapor deposition source 85 carries out vapor deposition of vapor deposition particles through the openings 82 of the shadow mask 81 onto the film formation substrate 200 upward from below (that is, up deposition; hereinafter referred to as "depo-up").

The injection holes 86 are, as illustrated in FIGS. 1 and 2, provided to face the respective openings 82 of the shadow mask 81 so as to be open in respective opening regions of the shadow mask 81. The injection holes 86 of the present embodiment are arranged one-dimensionally (i) along the direction in which the openings 82 of the shadow mask 81 are arranged next to one another and (ii) so as to face the respective openings 82 of the shadow mask 81.

Thus, as illustrated in FIGS. 1 and 2, the vapor deposition source 85 is formed to have a surface that faces the shadow mask 81, the surface (that is, the surface in which the injection holes 86 are provided) having, for example, a rectangular shape (belt shape) as viewed from the back surface side of the film formation substrate 200 (that is, in a plan view) so as to match the rectangular shape (belt shape) of the shadow mask 81.

In the mask unit 80, the shadow mask 81 and the vapor deposition source 85 are fixed in position relative to each other. Specifically, there is constantly a fixed gap g2 between (i) the shadow mask 81 and (ii) the surface of the vapor deposition source 85 in which surface the injection holes 86 are provided, and there is constantly a fixed positional relationship between (i) the openings 82 of the shadow mask 81 and (ii) the injection holes 86 of the vapor deposition source 85.

The injection holes 86 of the vapor deposition source 85 are each so placed as to coincide with the center of a corresponding opening 82 of the shadow mask 81 when the mask unit 80 is viewed from the back surface side of the film formation substrate 200 (that is, in a plan view).

The shadow mask 81 and the vapor deposition source 85 are, for example, attached to the mask holding member 87 (for example, an identical holder) for holding and fixing (i) the shadow mask 81 via the mask tension mechanism 88 and (ii) the vapor deposition source 85 (see FIG. 3). The shadow mask 81 and the vapor deposition source 85 are thus so integrated with each other as to be held and fixed in the respective positions relative to each other.

The shadow mask 81 is under tension caused by the mask tension mechanism 88. The shadow mask 81 is thus adjusted as appropriate so that no bend or elongation due to its own weight is caused.

The vapor deposition device 50 is arranged as described above such that (i) the film formation substrate 200 is adhered to a fixing plate by the substrate holding member 71 (electrostatic chuck), and is thus prevented from being bent due to its own weight and (ii) the shadow mask 81 is under tension caused by the mask tension mechanism 88 so that the distance between the film formation substrate 200 and the shadow mask 81 is uniformly maintained throughout the entire region by which the film formation substrate 200 overlaps the shadow mask 81 in a plan view.

The first shutter 89 is used according to need in order to control reaching of vapor deposition particles to the shadow mask 81. The first shutter 89 is either closed or opened by a shutter drive control section 105 (see FIG. 4) in accordance with a vapor deposition OFF signal or vapor deposition ON signal from a vapor deposition ON/OFF control section 104 (see FIG. 4) described below.

The first shutter 89 is, for example, so provided in the shape of a flat plate as to be capable of moving in a space between the shadow mask 81 and the vapor deposition source 85 (that is, capable of being inserted between them). The first shutter 89 is inserted between the shadow mask 81 and the vapor deposition source 85 to close the openings 82 of the shadow mask 81. Appropriately inserting the first shutter 89 between the shadow mask 81 and the vapor deposition source 85 can prevent vapor deposition on a portion for which vapor deposition is unnecessary (that is, a non vapor deposition region).

The shutter moving mechanism 110, as illustrated in FIG. 4, includes a second shutter 111 (shutter member), a shutter holding member 112 for holding the second shutter 111, and a motor 113.

The second shutter 111 is, as illustrated in FIG. 1, in the shape of a flat plate, for example. The second shutter 111 has, along the y axis direction, a length that is, for example, substantially equal to the length of the film formation substrate 200 along the y axis direction. The second shutter 111 has, along the x axis direction, an appropriate length as described below.

The second shutter 111, as illustrated in FIG. 14, blocks a vapor deposition flow B, which is a portion of a vapor deposition flow C of vapor deposition particles traveling from the vapor deposition source 85 toward the film formation substrate 200 and which travels toward a region 230 of the film formation substrate 200, the region 230 requiring no vapor deposition (hereinafter referred to as "vapor deposition unnecessary region"). In other words, the second shutter 111 controls the range of a vapor deposition flow C, which is a flow of vapor deposition particles emitted from the vapor deposition source 85. Vapor deposition particles emitted from the vapor deposition source 85 have a vapor deposition range defined by, for example, the shape of the injection holes 86 of the vapor deposition source 85 and/or a deposition preventing plate. The second shutter 111 is inserted across the vapor deposition flow C so that the vapor deposition range is limited to a vapor deposition region 210 of the film formation substrate 200. The second shutter 111 thus further limits the range of the vapor deposition flow C. Stated differently, the second shutter 111 determines an edge of the vapor deposition range of the vapor deposition flow C.

More specifically, the second shutter 111 is adjusted in position (that is, scanned) as described below to control the vapor deposition range of the vapor deposition flow C as described above. The film formation substrate 200, as illustrated in FIG. 14, has a boundary region 240 between the vapor deposition region 210 and the vapor deposition unnecessary region 230. The boundary region 240 is a buffer region on which vapor deposition particles may or may not be deposited. The second shutter 111 is so held by the shutter holding member 112 as to be parallel to the shadow mask 81 and away therefrom by a fixed interval. The second shutter 111 is so adjusted in position that a straight line m1 connecting (i) an injection hole 86 of the vapor deposition source 85 with (ii) one end 111*a* of opposite ends of the second shutter 111 which opposite ends are located along a substrate scanning direction, that is, along a direction of scanning the film formation substrate 200 (the direction of the relative movement) passes through an opening 82 of the shadow mask 81 to reach the boundary region 240. Stated differently, the second shutter 111 is so adjusted in position that the vapor deposition flow C emitted from the vapor deposition source 85 and traveling through the openings 82 to be deposited onto the film formation substrate 200 has a vapor deposition range with one end (that is, one of opposite ends located along the substrate scanning direction) that coincides with the boundary region 240.

In the case where there are a single vapor deposition region 210 and a single vapor deposition unnecessary region 230 on the film formation substrate 200 along the substrate scanning direction as illustrated in FIG. 14, the second shutter 111 has, along the substrate scanning direction, a length X that is determined from FIG. 15 to satisfy Expression 1 below.

[Math 1]

$$X \geq \frac{L2}{L1} \times D \qquad \text{Expression 1}$$

As illustrated in FIG. 15, the symbol D in Expression 1 represents the width of the vapor deposition unnecessary region 230 along the substrate scanning direction. The symbol L1 represents the interval between the injection holes 86 and the vapor deposition unnecessary region 230, whereas the symbol L2 represents the interval between the injection holes 86 and the second shutter 111. Stated differently, the symbol L1 indicates the shortest distance between the injection holes 86 and a plane including the vapor deposition unnecessary region 230, whereas the symbol L2 indicates the shortest distance between the injection holes 86 and a plane including the second shutter 111.

As illustrated in FIG. 15, Expression 1 is defined such that a triangle $P_0P_1P_2$ formed by the central point $P_0$ of each injection hole 86 and opposite end points $P_1$ and $P_2$ of the vapor deposition unnecessary region 230 along its width D is similar to a triangle $P_0P_3P_4$ formed by the central point $P_0$ and opposite end points $P_3$ and $P_4$ of the second shutter 111 along its length X.

Expression 1 may be fine-tuned in view of, for example, the thickness of the second shutter 111, the shape of an end surface of the second shutter 111, and/or the shape of the injection holes 86 of the vapor deposition source 85. Further, even if the vapor deposition unnecessary region varies in width D depending on the model of an organic EL panel, the use of a shutter having a sufficiently large length X allows Expression 1 to be satisfied. In addition, adjusting L2 also allows Expression 1 to be satisfied for various widths D. Thus, the use of a shutter having a sufficiently large length X eliminates the need to prepare a large number of second shutters 111, which can in turn reduce equipment costs.

The shutter holding member 112, as described above, holds the second shutter 111 so that the second shutter 111 is (i) placed between the shadow mask 81 and the first shutter 89 and (ii) separated from the shadow mask 81 by a fixed gap. The second shutter 111 may be held, instead of between the shadow mask 81 and the first shutter 89, between the film formation substrate 200 and the shadow mask 81. The shutter holding member 112 is, for example, so provided as to be capable of moving inside the vacuum chamber 60 along the substrate scanning direction to scan the second shutter 111 along the substrate scanning direction.

The motor 113, for example, moves the shutter holding member 112 along the substrate scanning direction in response to control by the motor drive control section 103.

This moves the second shutter 111 along the substrate scanning direction so that the second shutter 111 blocks a vapor deposition flow B as described above (that is, so that a straight line m1 connecting an injection hole 86 with one end 111a reaches the boundary region 240).

The vapor deposition device 50 is so adjusted that vapor deposition particles from the vapor deposition source 85 are scattered below the shadow mask 81. The vapor deposition device 50 may be arranged such that vapor deposition particles scattered beyond the shadow mask 81 are blocked as appropriate by, for example, a deposition preventing plate (shielding plate).

The vacuum chamber 60 is provided with, for example, image sensors 90 (see FIG. 4) each (i) attached to an outer surface of the vacuum chamber 60, (ii) including a CCD, and (iii) serving as image sensing means (image reading means). The vacuum chamber 60 is further provided with a control circuit 100 (i) attached to the outer surface of the vacuum chamber 60, (ii) connected to the image sensors 90, and (iii) serving as control means.

The image sensors 90 each function as position detecting means for use in an alignment of the film formation substrate 200 and the shadow mask 81.

The control circuit 100 includes: an image detecting section 101; a computing section 102; a motor drive control section 103; a vapor deposition ON/OFF control section 104; and a shutter drive control section 105.

As described above, the film formation substrate 200 includes, as illustrated in FIG. 1, alignment marker sections 220 provided (i) outside the vapor deposition region 210 and (ii) along, for example, the substrate scanning direction, the alignment marker sections 220 each including an alignment marker 221.

The image detecting section 101 detects, on the basis of an image captured by the image sensors 90, respective images of (i) the alignment markers 221 included in the film formation substrate 200 and (ii) the alignment markers 84 of the shadow mask 81. The image detecting section 101 further detects the start-end and rear end of the vapor deposition region 210 of the film formation substrate 200 on the basis of, among the alignment markers 221 included in the film formation substrate 200, (i) a start-end marker indicative of the start end of the vapor deposition region 210 and (ii) a rear-end marker indicative of the rear end of the vapor deposition region 210.

The image detecting section 101 detects the start end and rear end of the vapor deposition unnecessary region 230 as follows, for example: The film formation substrate 200 includes, for example, a start-end marker and a rear-end marker (not shown) respectively indicative of the start end and rear end of the vapor deposition unnecessary region 230. The image detecting section 101 detects those markers to detect the start end and rear end of the vapor deposition unnecessary region 230.

The image detecting section 101 further detects, as described below, an edge section of the film formation substrate 200 which edge section is present in the substrate scanning direction. The film formation substrate 200 includes, for example, edge section markers (not shown) indicative of respective edge sections of the film formation substrate 200 which edge section is present in the substrate scanning direction. The image detecting section 101 detects those edge section markers to detect the respective edge sections of the film formation substrate 200 which edge section is present in the substrate scanning direction.

The start end and rear end of the vapor deposition unnecessary region 230 and the edge sections of the film formation substrate 200 may be detected by a method other than the above method of using markers: For example, the image detecting section 101 may determine, when the film formation substrate 200 has been scanned for a predetermined distance after the image detecting section 101 has detected the rear end of the vapor deposition region 210, that the image detecting section 101 has detected the start end of the vapor deposition unnecessary region 230. Similarly, the image detecting section 101 may determine, when the film formation substrate 200 has been scanned for a predetermined distance, different from the above predetermined distance, after the image detecting section 101 has detected the rear end of the vapor deposition region 210, that the image detecting section 101 has detected the rear end of the vapor deposition unnecessary region 230. Further, the image detecting section 101 may determine, when the film formation substrate 200 has been scanned for a predetermined distance, different from the above two predetermined distances, after the image detecting section 101 has detected the rear end of the vapor deposition region 210, that the image detecting section 101 has detected an edge section of the vapor deposition unnecessary region 230. These detection operations may alternatively be carried out by the computing section 102 or the motor drive control section 103.

The start-end marker and the rear-end marker mentioned above may be identical to each other. In this case, the image detecting section 101 detects, with respect to the substrate scanning direction, whether (i) a particular end of the vapor deposition region 210 is its start end or rear end and whether (ii) a particular end of the vapor deposition unnecessary region 230 is its start end or rear end.

The computing section 102 determines, from the image detected by the image detecting section 101, the amount of movement of the film formation substrate 200 and the shadow mask 81 relative to each other (for example, the amount of movement of the film formation substrate 200 relative to the shadow mask 81). The computing section 102, for example, measures the amount of positional difference (that is, a shift component along the x axis direction and the y axis direction, and a rotation component on the x-y plane) between the alignment markers 221 and the alignment markers 84 to determine a correction value for a substrate position of the film formation substrate 200 by computation. In other words, the computing section 102 determines the correction value by computation with respect to the direction perpendicular to the substrate scanning direction and a rotation direction of the film formation substrate 200.

The rotation direction of the film formation substrate refers to a direction of rotation on the x-y plane about a z axis, as a rotation axis, at the center of a film formation surface of the film formation substrate 200.

The correction value is outputted in the form of a correction signal to the motor drive control section 103. The motor drive control section 103, on the basis of the correction signal from the computing section 102, drives the motor 72 connected to the substrate holding member 71 and thus corrects the substrate position of the film formation substrate 200.

How the substrate position is corrected with use of the alignment markers 84 and 221 is described below together with example shapes of the alignment markers 84 and 221.

The motor drive control section 103 drives the motor 72 to move (scan) the film formation substrate 200 in the horizontal direction as mentioned above.

The motor drive control section 103, on the basis of (i) the result of the detection by the image detecting section 101 (that is, the start end and rear end of the vapor deposition region 210 and those of the vapor deposition unnecessary region 230) and (ii) the amount of movement of the film formation substrate 200 in the horizontal direction, recognizes the respective positions of the vapor deposition region 210, the vapor deposition unnecessary region 230, the boundary region 240, and the openings 82 relative to one another, and moves the second shutter 111 along the substrate scanning direction (that is, the direction in which the film formation substrate 200 is moved) so that the second shutter 111 blocks a vapor deposition flow B as described above.

The vapor deposition ON/OFF control section 104, for example, generates (i) a vapor deposition ON signal when the image detecting section 101 detects the start end of the vapor deposition region 210 and (ii) a vapor deposition OFF signal when the image detecting section 101 detects the rear end of film formation substrate 200.

The shutter drive control section 105 (i) closes the first shutter 89 upon receipt of a vapor deposition OFF signal from the vapor deposition ON/OFF control section 104 and (ii) opens the first shutter 89 upon receipt of a vapor deposition ON signal from the vapor deposition ON/OFF control section 104.

The following describes (i) how the substrate position is corrected with use of the alignment markers 84 and 221 and (ii) example shapes of the alignment markers 84 and 221.

(a) through (c) of FIG. 5 illustrate example shapes of the alignment markers 84 and 221. (b) and (c) of FIG. 5 each illustrate only two of the juxtaposed alignment markers 84 and of the juxtaposed alignment markers 221 for convenience of illustration.

The computing section 102, on the basis of an image of the alignment markers 84 and 221, the image having been detected by the image detecting section 101, measures (determines) (i) a distance r between respective ends (outer edges) of each alignment marker 84 and its corresponding alignment marker 221 along the x axis direction and (ii) a distance q between respective ends (outer edges) of each alignment marker 84 and its corresponding alignment marker 221 along the y axis direction. The computing section 102 thus determines the amount of positional difference in alignment to compute a correction value for a substrate position.

In the case where, for example, the substrate scanning direction is the x axis direction, the sign "r" in (a) through (c) of FIG. 5 indicates a distance between the respective ends along the substrate scanning direction, whereas the sign "q" in (a) through (c) of FIG. 5 indicates a distance between the respective ends along the direction perpendicular to the substrate scanning direction. The computing section 102 measures (determines) the distances r and q at, for example, opposite ends of the vapor deposition region 210 of the film formation substrate 200 to determine the amount of shift caused in alignment during a substrate scan.

The present embodiment describes an example case that involves simultaneously scanning the film formation substrate 200 and carrying out an alignment between the shadow mask 81 and the film formation substrate 200. The present embodiment is, however, not limited to such an arrangement. The present embodiment can alternatively be arranged such that a sufficient alignment is carried out before a substrate scan and that no alignment is carried out during a substrate scan.

The present embodiment can be arranged such that, for example, the film formation substrate 200 is moved along a first side of the vapor deposition region 210 of the film formation substrate 200 (for example, along the y axis direction in (a) through (c) of FIG. 5), and is then moved along a second side (for example, the x axis direction in (a) through (c) of FIG. 5) orthogonal to the first side. In this case, the sign "r" in (a) through (c) of FIG. 5 indicates a distance between the respective ends opposite from each other in the direction perpendicular to the substrate scanning direction, whereas the sign "q" in (a) through (c) of FIG. 5 indicates a distance between the respective ends opposite from each other in the direction (shift direction) in which the film formation substrate 200 is moved.

In this case, the computing section 102 measures distances r and q for alignment markers located at the four corners, and thus determines (i) the amount of positional difference present in alignment at the start of a substrate scan and (ii) the amount of positional difference present in alignment after the film formation substrate 200 is moved (shifted).

The alignment markers 84 and 221 may each be, as illustrated in (a) through (c) of FIG. 5, in the shape of, for example, (i) a belt, (ii) a quadrangle such as a square, (iii) a frame, or (iv) a cross. The alignment markers 84 and 221 are thus not particularly limited in terms of shape.

In the case where a sufficient alignment is carried out before a substrate scan and no alignment is carried out during a substrate scan as described above, the alignment markers 221 do not need to be provided along a side of the vapor deposition region 210 of the film formation substrate 200, and may instead be provided at, for example, the four corners of the film formation substrate 200.

The following describes in detail a method for forming a pattern of an organic EL layer by using, as a device for producing the organic EL display device 1, the above vapor deposition device 50 of the present embodiment.

The description below deals with an example case that, as described above, involves (i) using, as the film formation substrate 200, a TFT substrate 10 obtained after the hole injection layer/hole transfer layer vapor deposition step (S2) is finished and (ii) carrying out, as a pattern formation of an organic EL layer, a discriminative application formation of luminescent layers 23R, 23G, and 23B during the luminescent layer vapor deposition step (S3).

The TFT substrate 10, as illustrated in FIG. 16, has a single vapor deposition region 210 in the shape of, for example, a rectangle to serve as a display region (pixel region). The TFT substrate 10 also has a terminal section region (vapor deposition unnecessary region) 230 at a position upstream from the vapor deposition region 210 along the substrate scanning direction across a boundary region 240. The TFT substrate 10 further has, on opposite sides of the vapor deposition region 210 that are present in the direction orthogonal to the substrate scanning direction, terminal section regions (vapor deposition unnecessary regions) 230a each with a second electrode connecting section (vapor deposition unnecessary region) 230b located between the vapor deposition region 210 and itself.

The present embodiment assumed (i) 100 mm for the gap g2 between the vapor deposition source 85 and the shadow mask 81 (that is, the distance between a surface of the vapor deposition source 85 in which surface the injection holes 86 are provided and the shadow mask 81) and (ii) 200 μm for the distance between the TFT substrate 10 serving as the film formation substrate 200 and the shadow mask 81.

The present embodiment further assumed (i) for a substrate size of the TFT substrate 10, 320 mm along the scanning direction and 400 mm along the direction perpendicular to the scanning direction and (ii) for widths of the vapor deposition region (display region), 260 mm for the width along the scanning direction (that is, the width d4) and 310 mm for the width (that is, the width d3) along the direction perpendicular to the scanning direction.

The present embodiment assumed 360 μm (along the scanning direction)×90 μm (along the direction perpendicular to the scanning direction) for widths of the openings 15R, 15G, and 15B for the respective sub-pixels 2R, 2G, and 2B of the TFT substrate 10. The present embodiment further assumed 480 μm (along the scanning direction)×160 μm (along the direction perpendicular to the scanning direction) for a pitch between the openings 15R, 15G, and 15B. The pitch between the openings 15R, 15G, and 15B (that is, a pitch between pixel openings) refers to a pitch between respective openings 15R, 15G, and 15B for the sub-pixels 2R, 2G, and 2B adjacent to one another, but not to a pitch between sub-pixels of an identical color.

The present embodiment used, as the shadow mask 81, a shadow mask having (i) a length of 600 mm along the width d1 (that is, the width along the direction perpendicular to the scanning direction) along each long side 81a (corresponding to the long-axis direction) and (ii) a length of 200 mm along the width d2 (that is, the width along the scanning direction) along each short side 81b (corresponding to the short-axis direction). The shadow mask 81 had openings 82 (i) each having opening widths of 150 mm (along the width d5 in the long-axis direction; see FIG. 1)×130 μm (along the width d6 in the short-axis direction; see FIG. 1), (ii) having a length of 350 μm along an interval d8 (see FIG. 1) between adjacent openings 82 and 82, and (iii) having a length of 480 μm along a pitch p (see FIG. 1) between respective centers of adjacent openings 82 and 82.

In the present embodiment, the shadow mask 81 preferably has a length of not less than 200 mm for the width d2 (that is, a short-side length) along each short side 81b. This is due to the reason below.

The vapor deposition rate is preferably not higher than 10 nm/s. If the vapor deposition rate exceeds 10 nm/s, a deposited film (that is, a vapor-deposited film) will have a decreased uniformity, thus resulting in a decreased organic EL property.

A vapor-deposited film typically has a film thickness of not larger than 100 nm. A film thickness of larger than 100 nm will require application of a high voltage, and consequently increase power consumption of a produced organic EL display device. The above vapor deposition rate and the film thickness of a vapor-deposited film allow estimation of a necessary vapor deposition period of 10 seconds.

Due to a limit in processing capability (tact time), a scan rate of 13.3 mm/s or higher is at least necessary in order to, for example, complete vapor deposition with respect to a 2 m-wide glass substrate in 150 seconds. The processing time of 150 seconds is a tact time that allows processing of about 570 glass substrates per day.

Securing the above vapor deposition period of 10 seconds at the above scan rate requires the shadow mask 81 to have openings 82 each having a width of at least 133 mm along the scanning direction.

Assuming that approximately 30 mm is appropriate for the distance (margin width d7; see FIG. 1) from each end of an opening 82 to a corresponding end of the shadow mask 81, the shadow mask 81 requires a length of 133+30+30≈200 mm for the width along the scanning direction.

The shadow mask 81 thus preferably has a short side length (that is, the width d2) of not less than 200 mm. The short side length is, however, not limited to not less than 200 mm if there is a change in the vapor deposition rate, the film thickness of a vapor-deposited film, and/or the allowable amount of the tact time.

The present embodiment assumes 30 mm/s for the rate of scanning the TFT substrate 10.

FIG. 10 is a flowchart illustrating an example method for forming a predetermined pattern on the TFT substrate 10 with use of the vapor deposition device 50 of the present embodiment.

The following specifically describes, with reference to the flow illustrated in FIG. 10, a method of FIG. 10 for forming luminescent layers 23R, 23G, and 23B with use of the vapor deposition device 50.

The method first, as illustrated in FIG. 3, places (fixes) the shadow mask 81 above the vapor deposition source 85 in the vacuum chamber 60 with use of the mask holding member 87 via the mask tension mechanism 88, and horizontally holds the shadow mask 81 under tension by the mask tension mechanism 88 so that no bending or elongation due to the self weight is caused to the shadow mask 81. During this step, the method simultaneously (i) maintains the distance between the vapor deposition source 85 and the shadow mask 81 with use of the mask holding member 87 and (ii) carries out an alignment with use of the alignment markers 84 of the shadow mask 81 in such a manner that the substrate scanning direction is identical to the long-axis direction of the stripe-shaped openings 82 provided in the shadow mask 81. The above step assembles the mask unit 80 (preparation of a mask unit).

The method next inserts the TFT substrate 10 in the vacuum chamber 60 and, as indicated in FIG. 10, carries out a rough alignment with use of the alignment markers 221 of the TFT substrate 10 as the film formation substrate 200 so that each sub-pixel column of an identical color of the TFT substrate 10 has a direction that is identical to the substrate scanning direction (S11). The method holds the TFT substrate 10 with use of the substrate holding member 71 so that no bending due to the self weight is caused to the TFT substrate 10.

The method then carries out a rough alignment between the TFT substrate 10 and the shadow mask 81 (S12). The method further adjusts the gap g1 (substrate-mask gap) between the TFT substrate 10 and the shadow mask 81 so that the gap is uniform, and places the TFT substrate 10 and the shadow mask 81 so that they face each other. This allows the TFT substrate 10 and the shadow mask 81 to be aligned with each other (S13). The present embodiment adjusted the gap g1 between the TFT substrate 10 and the shadow mask 81 to roughly 200 μm throughout the entire TFT substrate 10.

The method next adjusted an alignment between the TFT substrate 10 and the shadow mask 81 in S14, while scanning the TFT substrate 10 at 30 mm/s and scanning the second shutter 111 in S15 for vapor deposition of materials for the red luminescent layer 23R onto the TFT substrate 10. This operation carried out a substrate scan in such a manner that the TFT substrate 10 passed through a position above the shadow mask 81. As described below, the above operation, in S14, simultaneously carried out the scan and a precise alignment with use of the alignment markers 84 and 221 so that the openings 82 of the shadow mask 81 coincide with red sub-pixel 2R columns.

The luminescent layer 23R was made of (i) 3-phenyl-4(1'-naphthyl)-5-phenyl-1,2,4-triazole(TAZ) (host material) and (ii) bis(2-(2'-benzo[4,5-α]thienyl)pyridinato-N,C3')iridium (acetylacetonate) (btp2Ir(acac)) (red-light emitting dopant). These materials (red organic materials) were codeposited at respective vapor deposition rates of 5.0 nm/s and 0.53 nm/s to form the luminescent layer 23R.

Vapor deposition particles of the red organic materials which particles are emitted from vapor deposition source 85 are deposited, through the openings 82 of the shadow mask 81 and onto positions on the TFT substrate 10 that face the respective openings 82 of the shadow mask 81, when the TFT substrate 10 passes through a position directly above the shadow mask 81. In the present embodiment, the TFT substrate 10 having passed through the position directly above the shadow mask 81 had the red organic materials deposited thereon at a film thickness of 25 nm.

The following describes, with reference to FIG. 11, a method for adjusting an alignment in S14 above.

FIG. 11 is a flowchart illustrating the alignment adjustment method. The alignment is adjusted as illustrated in the flow of FIG. 11.

The above method first captures a substrate position of the TFT substrate 10 as the film formation substrate 200 with use of the image sensors 90 (S21).

Next, the image detecting section 101, on the basis of the image captured by the image sensors 90, detects respective images of (i) the alignment markers 221 of the TFT substrate 10 and of (ii) the alignment markers 84 of the shadow mask 81 (S22).

Then, the computing section 102 calculates, from the respective images of the alignment markers 221 and 84, the images having been detected by the image detecting section 101, the amount of positional difference between the alignment markers 221 and the alignment markers 84 to determine a correction value for a substrate position by computation (S23).

Next, the motor drive control section 103 drives the motor 72 on the basis of the correction value to correct the substrate position (S24).

Then, the image sensors 90 detect the substrate position as corrected, after which the steps S21 through S24 are repeated.

As described above, the present embodiment causes the image sensors 90 to repeatedly detect a substrate position to correct it. This makes it possible to simultaneously carry out a substrate scan and correct a substrate position, and consequently to form a film while carrying out a precise alignment between the TFT substrate 10 and the shadow mask 81.

The above method switches on the vapor deposition source 85 in S15. The vapor deposition source 85 is switched on through the flow indicated in FIG. 13. Specifically, as indicated in FIG. 13, the substrate position of the TFT substrate 10 serving as the film formation substrate 200 is, as described above, constantly captured by the image sensors 90 during a vapor deposition process (S41).

The image detecting section 101 detects, as an alignment marker 221 of the TFT substrate 10, a start-end marker indicative of the start-end of the vapor deposition region to detect the start-end of the vapor deposition region 210 (S42).

When the image detecting section 101 has detected the start end of the vapor deposition region 210, the vapor deposition ON/OFF control section 104 generates a vapor deposition ON signal (S43).

The shutter drive control section 105, upon receipt of the vapor deposition ON signal from the vapor deposition ON/OFF control section 104, opens the first shutter 89 (S44). The first shutter 89 thus opened allows vapor deposition particles to reach the mask, which achieves the state of vapor deposition ON(S45). The vapor deposition source 85 is switched on as described above.

The above method scans the TFT substrate 10 and the second shutter 111 in S16 for vapor deposition onto the TFT substrate 10.

As illustrated in FIG. 14, the above method, during S16, causes the second shutter 111 to be so scanned that the vapor deposition flow C emitted from the vapor deposition source 85 and traveling through the openings 82 to be deposited onto the TFT substrate 10 has a vapor deposition range having an end (that is, an upstream end along the substrate scanning direction) that coincides with the boundary region 240. The scan of the second shutter 111 is completely unsynchronized with the scan of the TFT substrate 10: The rate and position of the scan are so adjusted that the vapor deposition range has an end that coincides with the boundary region 240.

More specifically, the above method scans the second shutter 111 (that is, adjusts the position of the second shutter 111) as illustrated in FIGS. 17 through 19.

The description below uses (i) the term "total vapor deposition flow C" to refer to the entire vapor deposition flow that travels from the vapor deposition source 85 through the openings 82 to reach the TFT substrate 10, (ii) the term "vapor deposition flow A" to refer to a portion of the total vapor deposition flow C which portion travels toward the vapor deposition region 210 of the TFT substrate 10, and (iii) the term "vapor deposition flow B" to refer to a portion of the total vapor deposition flow C which portion travels toward the vapor deposition unnecessary region 230 of the TFT substrate 10. In other words, the vapor deposition flow A is a vapor deposition flow that is not to be limited by the second shutter 111, whereas the vapor deposition flow B is a vapor deposition flow that is to be limited by the second shutter 111.

The start of a substrate scan has a state in which, as illustrated in FIG. 17, the vapor deposition region 210 has just reached a position directly above an opening 82. In this state, only the vapor deposition flow A is present out of the two vapor deposition flows A and B. The second shutter 111 is, in this state (escape period), so adjusted in position as not to block the vapor deposition flow A (that is, as to escape from the vapor deposition flow A).

A further scan of the TFT substrate 10 achieves a state in which, as illustrated in FIG. 18, both the vapor deposition region 210 and the vapor deposition unnecessary region 230 are present directly above the opening 82. The second shutter 111 is, in this state (control period 1), so adjusted in position as to block not the vapor deposition flow A but only the vapor deposition flow B.

A still further scan of the TFT substrate 10 achieves a state in which, as illustrated in FIG. 19, only the vapor deposition unnecessary region 230 is present directly above the opening 82. In this state, only the vapor deposition flow B is present out of the two vapor deposition flows A and B. The second shutter 111 is, in this state (control period 2), so adjusted in position as to block the vapor deposition flow B.

When a still further scan of the TFT substrate 10 has caused the vapor deposition unnecessary region 230 to be absent from the position directly above the opening 82, the second shutter 111, as in the case illustrated in FIG. 18, enters an escape period (that is, so adjusted in position as not to block the vapor deposition flow C). Scanning the second shutter 111 as described above prevents vapor deposition particles from being deposited onto the vapor deposition unnecessary region 230, and allows vapor deposition particles to be deposited onto the vapor deposition region 210 sufficiently. The above method carries out the precise alignment of S14 even during S16.

The above method adjusts the film thickness of the luminescent layer 23R in S17 on the basis of (i) a reciprocating scan (that is, reciprocating movement of the TFT substrate 10) and (ii) a scan rate. The present embodiment, after scanning the TFT substrate 10 in S16 until the scan reaches an edge section upstream along the substrate scanning direction, (i) reverses the direction of scanning the TFT substrate 10, and (ii) further deposits the red organic materials by the same method as in S16 at the positions at which the red organic materials have been deposited (S16). In the case where the direction of scanning the TFT substrate 10 has been reversed, the second shutter 111 is scanned in the order (FIG. 19->FIG. 18->FIG. 17) opposite from the above order (FIG. 17->FIG. 18->FIG. 19). This formed a luminescent layer 23R having a film thickness of 50 nm.

The reciprocating scan in S17 is, more specifically, carried out as follows: First, the above method scans the TFT substrate 10 in S14 while carrying out a precise alignment, and the image detecting section 101 detects an edge section of the TFT substrate 10 which edge section is upstream along the substrate scanning direction. The motor drive control section 103, in response, drives the motor 72 to reverse the direction of scanning the TFT substrate 10. Then, while carrying out a precise alignment indicated in S14 again, the above method scans the second shutter 111 in the order (FIG. 19->FIG. 18->FIG. 17) opposite from the scan order in S16 for vapor deposition onto the TFT substrate 10.

The above operation forms a luminescent layer 23R having a desired film thickness as indicated in S17.

The above method switches off the vapor deposition source 85 in S18. The vapor deposition source 85 is switched off through the flow indicated in FIG. 12.

Specifically, as indicated in FIG. 12, the substrate position of the TFT substrate 10 serving as the film formation substrate 200 is constantly captured by the image sensors 90 during a vapor deposition process as described above with reference to FIG. 11 (S31).

After the substrate scanning direction has been reversed, the image detecting section 101, as described above, detects from an image captured by the image sensor 90 an edge section of the film formation substrate 200 which edge section is present in the substrate scanning direction (S32).

When the image detecting section 101 has detected an edge section of the film formation substrate 200 as described above, the vapor deposition ON/OFF control section 104 generates a vapor deposition OFF signal (S33).

The image detecting section 101 may, instead of detecting an edge section of the film formation substrate 200 as described above, (i) recognize the respective positions of the shadow mask 81 and the film formation substrate 200 relative to each other on the basis of (a) the alignment markers 221 and 84 detected through the image detection and (b) the amount of movement of the film formation substrate 200, (ii) determine from the recognized positional relationship whether the vapor deposition region 210 has passed through a position directly above an opening 82, and (iii) if the image detecting section 101 has detected that the vapor deposition region 210 has passed through the position directly above the opening 82, cause the vapor deposition ON/OFF control section 104 to generate a vapor deposition OFF signal.

The shutter drive control section 105, upon receipt of the vapor deposition OFF signal from the vapor deposition ON/OFF control section 104, closes the shutter 89 (S34). The shutter 89 thus closed prevents vapor deposition particles from reaching the mask, which achieves the state of vapor deposition OFF (S35). The vapor deposition source 85 is switched off as described above.

The present embodiment, after the step S18 above, retrieved from the vacuum chamber 60 the TFT substrate 10 on which the luminescent layer 23R was formed (S 19), and then formed a green luminescent layer 23G, with use of (i) a mask unit 80 for forming the green luminescent layer 23G and (ii) a vacuum chamber 60, in a manner similar to the above process of forming the luminescent layer 23R.

The present embodiment, after thus forming the luminescent layer 23G, formed a blue luminescent layer 23B, with use of (i) a mask unit 80 for forming the blue luminescent layer 23B and (ii) a vacuum chamber 60, in a manner similar to the respective processes of forming the luminescent layers 23R and 23G.

Specifically, the present embodiment, for each of the processes of forming the luminescent layers 23G and 23B, prepared a shadow mask 81 having openings 82 at positions for a corresponding one of the luminescent layers 23G and 23B. The present embodiment placed each shadow mask 81 in a vacuum chamber 60 for forming a corresponding one of the luminescent layers 23G and 23B, and thus scanned the TFT substrate 10 for vapor deposition while carrying out an alignment so that the openings 82 of the shadow mask 81 coincide with a corresponding one of (i) sub-pixel 2G columns and (ii) sub-pixel 2B columns.

The luminescent layer 23G was made of (TAZ) (host material) and Ir(ppy) 3 (green-light emitting dopant). These materials (green organic materials) were codeposited at respective vapor deposition rates of 5.0 nm/s and 0.67 nm/s to form the luminescent layer 23G.

The luminescent layer 23B was made of TAZ (host material) and 2-(4'-t-butyl phenyl)-5-(4"-biphenylyl)-1,3,4-oxadiazole (t-Bu PBD) (blue-light emitting dopant). These materials (blue organic materials) were codeposited at respective vapor deposition rates of 5.0 nm/s and 0.67 nm/s to form the luminescent layer 23B.

The luminescent layers 23G and 23B each had a film thickness of 50 nm.

The above steps form, in the vapor deposition region 210 of the TFT substrate 10, stripe-shaped patterns of respective luminescent layers 23R, 23G, and 23B of red (R), green (G), and blue (B) as illustrated in FIG. 20. The TFT substrate 10 prepared as above has no luminescent layer 23R, 23G, or 23B formed in the vapor deposition unnecessary regions 230a and 230 such as the terminal section region (particularly, the vapor deposition unnecessary region 230 located upstream from the vapor deposition region 210 along the substrate scanning direction).

Conventional techniques, on the other hand, unfortunately allow luminescent layers 23R, 23G, and 23B (vapor-deposited films) to be formed, as illustrated in FIG. 21, not only in the vapor deposition region 210 but also in the vapor deposition unnecessary region 230 located upstream from the vapor deposition region 210 along the substrate scanning direction. Conventional techniques thus wipe off a vapor-deposited film in the vapor deposition unnecessary region 230 with use of an organic solvent during a later step. Conventional techniques, as a result, pose the following problems (1) to (3):

(1) Insufficient wiping leaves residues.

(2) The wiping causes a different foreign body to be present on a surface. This causes a defect in, for example, connection with an external circuit, and thus decreases yield of the organic EL display device.

(3) In the case where the production involves sealing with use of a sealing resin or the like, the organic solvent damages the sealing resin, which may decrease reliability of the organic EL display device.

The present embodiment forms no vapor-deposited film in the vapor deposition unnecessary region 230, and thus eliminates the need for the above wiping. The present embodiment can consequently avoid the above problems (1) to (3).

The present embodiment forms no vapor-deposited film in the terminal section region (vapor deposition unnecessary region) 230 as described above. This makes it possible to suitably connect a terminal section T to the terminal section region 230 as illustrated in (a) of FIG. 22. Conventional techniques, on the other hand, unfortunately allow a vapor-deposited film J to be formed in the terminal section region 230 as illustrated in (b) of FIG. 22. This causes a terminal section T to be connected to the terminal section region 230 through the vapor-deposited film J, and thus makes it impossible to suitably connect the terminal section T to the terminal section region 230.

The present embodiment has described above an example in which the vapor deposition unnecessary region 230 is a terminal section region. In the case where no vapor-deposited film needs forming in a sealing region as well, such a sealing region simply needs to be handled as a vapor deposition unnecessary region 230.

The present embodiment, as described above, prepares a movable second shutter 111 and adjusts the position of the second shutter 111 so that the second shutter 111 blocks a portion of a vapor deposition flow of vapor deposition particles traveling from the vapor deposition source 85 through the openings 82 of the shadow mask 81 to reach the film formation substrate 200, the portion being a vapor deposition flow B traveling toward the vapor deposition unnecessary region 230 of the film formation substrate 200. The present embodiment thus makes it possible to prevent vapor deposition on a vapor deposition unnecessary region 230 without reducing the amount of vapor deposition on an edge section of the vapor deposition region 210 on the film formation substrate 200.

The present embodiment simply controls the movement of the second shutter 111 simultaneously with carrying out vapor deposition, and does not need to add a step to deal, as conventional, with a vapor-deposited film formed in the vapor deposition unnecessary region 230. The present embodiment thus prevents the production of an organic EL display device from requiring more days due to such step addition, and in turn makes it possible to produce an inexpensive organic EL display device.

The present embodiment is arranged such that the mask unit 80 is fixedly placed in the vacuum chamber 60. The present embodiment is, however, not limited to such an arrangement.

The vapor deposition device 50 may include, instead of the substrate moving mechanism 70, (i) a substrate holding member (for example, an electrostatic chuck) for fixing the film formation substrate 200 and (ii) a mask unit moving mechanism (mask unit moving means) for moving the mask unit 80 relative to the film formation substrate 200 while maintaining the respective positions of the shadow mask 81 and the vapor deposition source 85 relative to each other. The vapor deposition device 50 may alternatively include both the substrate moving mechanism 70 and the mask unit moving mechanism. The substrate moving mechanism 70 and the mask unit moving mechanism may each be, for example, a roller-type moving mechanism or a hydraulic moving mechanism.

In other words, the film formation substrate 200 and the mask unit 80 simply need to be so provided that at least one of them is moveable relative to the other. The advantages of the present invention can be achieved regardless of which of the film formation substrate 200 and the mask unit 80 is arranged to move. In this case, the second shutter 111 is scanned in the direction of the above relative movement.

In the case where the mask unit 80 is moved relative to the film formation substrate 200 as described above, the mask unit 80 is arranged, for example, such that the shadow mask 81 and the vapor deposition source 85 are moved, relative to the film formation substrate 200, together with the mask holding member 87 (for example, an identical holder). This arrangement makes it possible to move the mask unit 80 relative to the film formation substrate 200 while maintaining the respective positions of the shadow mask 81 and the vapor deposition source 85 relative to each other.

In the case where the mask unit 80 is moved relative to the film formation substrate 200 as described above, the shadow mask 81 and the vapor deposition source 85 are preferably so held by, for example, an identical holder (holding member; holding means) as to be integrated with each other.

In the case where the film formation substrate 200 is moved relative to the mask unit 80 as described above, the shadow mask 81 and the vapor deposition source 85 simply need to be fixed in position relative to each other, but is not necessarily integrated with each other.

The mask unit 80 may be arranged, for example, such that (i) the vapor deposition source 85 is fixed to, for example, a bottom wall among inner walls of the vacuum chamber 60, (ii) the mask holding member 87 is fixed to one of the inner walls of the vacuum chamber 60, and consequently (iii) the shadow mask 81 and the vapor deposition source 85 are fixed in position relative to each other.

The present embodiment describes an example case in which the openings 82 of the shadow mask 81 are aligned with the injection holes 86 of the vapor deposition source 85 so that the injection holes 86 are each positioned inside one of the openings 82 in a plan view and that the openings 82 are provided in a one-to-one correspondence with the injection holes 86. The present embodiment is, however, not limited to such an arrangement. The openings 82 do not necessarily need to be provided (i) to face the injection holes 86 or (ii) in a one-to-one correspondence with the injection holes 86.

Specifically, the openings 82 may each have a pitch p that is unequal to the pitch of an injection hole 86. Further, the widths d5 and d6 of an opening 82 do not need to match the opening width (opening diameter) of an injection hole 86. For example, in the example illustrated in FIG. 1, the injection holes 86 may each have an opening diameter that is larger or smaller than the width d6 of an opening 82. In addition, a plurality of injection holes 86 may be provided to correspond to a single opening 82, whereas a single injection hole 86 may be provided to correspond to a plurality of openings 82. Further, a part (that is, at least one) of a plurality of injection holes 86 or a partial region of an injection hole 86 may be provided to face a non-opening section (that is, a region of the shadow mask 81 which region is other than the openings 82; for example, a region between openings 82 and 82).

To improve material use efficiency, the openings 82 and the injection holes 86 are desirably provided in a one-to-one correspondence with the each other.

The present embodiment describes an example case in which both (i) the openings 82 of the shadow mask 81 and (ii) the injection holes 86 of the vapor deposition source 85 are arranged one-dimensionally. The present embodiment is, however, not limited to such an arrangement. The openings 82 of the shadow mask 81 and the injection holes 86 of the vapor deposition source 85 simply need to be so provided as to face each other, and may alternatively be arranged two-dimensionally.

The present embodiment describes an example case involving a plurality of openings 82 in the shadow mask 81 and a plurality of injection holes 86 in the vapor deposition source 85. The present embodiment is, however, not limited to such an arrangement. The shadow mask 81 is simply required to include at least one opening 82, whereas the vapor deposition source 85 is simply required to include at least one injection hole 86.

In other words, the present embodiment may alternatively be arranged such that the shadow mask 81 includes only one opening 82 and that the vapor deposition source 85 includes only one injection hole 86. Even this arrangement makes it possible to form a predetermined pattern on the film formation substrate 200 by (i) moving at least one of the mask unit 80 and the film formation substrate 200 relative to the other and (ii) sequentially depositing vapor deposition particles onto the vapor deposition region 210 of the film formation substrate 200 through the openings 82 of the shadow mask 81.

The present embodiment, which does not particularly describe a mechanism for limiting spread of a vapor deposition flow, may include, for example, a limiting plate inserted between the vapor deposition source 85 and the shadow mask 81 which limiting plate can limit, to a fixed amount, spread of a vapor deposition flow emitted from the injection holes 86. Such a structure can limit the angle at which vapor deposition particles pass through the openings 82 and reach the vapor deposition region 210 of the film formation substrate 200. This structure can thus further prevent blurring of a pattern on the film formation substrate.

The present embodiment describes an example case in which the shadow mask 81 includes slit-shaped openings 82. The shape of the openings 82 can, however, be simply set as appropriate to form a desired vapor deposition pattern, and is thus not particularly limited to any specific one.

The present embodiment describes an example case in which the substrate moving mechanism 70 includes an electrostatic chuck as the substrate holding member 71. Using the electrostatic chuck to hold the film formation substrate 200 as described above can effectively prevent self-weight bending of the film formation substrate 200.

The present embodiment is, however, not limited to such an arrangement. Depending on the size of the film formation substrate 200, the substrate holding member 71 may be, for example, a holding member such as a roller for applying tension to the substrate to mechanically sandwich and hold it.

The present embodiment describes an example case involving, as the first shutter 89, a shutter capable of moving in a space between the shadow mask 81 and the vapor deposition source 85. The present embodiment is, however, not limited to such an arrangement. The present embodiment may alternatively be arranged, for example, such that (i) the vapor deposition source 85 is a vapor deposition source 85 that can be switched ON/OFF and that (ii) when a portion of the film formation substrate 200 which portion needs no vapor deposition is positioned in a region (that is, a region facing an opening 82) that faces an opening region of the shadow mask 81, vapor deposition is turned OFF so that no vapor deposition molecules fly.

The present embodiment may alternatively be arranged, for example, such that the first shutter 89 is a first shutter 89 provided to the vapor deposition source 85 and serving to close the injection holes 86 of the vapor deposition source 85 to block emission (release) of vapor deposition particles.

The present embodiment may further alternatively be arranged such that instead of providing the first shutter 89 to the injection holes 86, the vapor deposition source 85 is switched ON/OFF on the basis of a vapor deposition ON signal or a vapor deposition OFF signal to stop the generation itself of vapor deposition particles.

The present embodiment describes an example method for producing, as described above, an organic EL display device 1 of the bottom emission type, which extracts light from the TFT substrate 10 side. The present embodiment is, however, not limited to such production. The present invention is also suitably applicable to an organic EL display device 1 of a top emission type, which extracts light from the sealing substrate 40 side.

The present embodiment describes an example case that uses a glass substrate as a supporting substrate for each of the TFT substrate 10 and the sealing substrate 40. The present embodiment is, however, not limited to such an arrangement.

The respective supporting substrates for the TFT substrate 10 and the sealing substrate 40 may, for example, each be, other than a glass substrate, a transparent substrate such as a plastic substrate in the case where the organic EL display device 1 is an organic EL display device of the bottom emission type. In the case where the organic EL display device 1 is an organic EL display device of the top emission type, the respective supporting substrates may, for example, each be an opaque substrate such as a ceramics substrate other than the above transparent substrate.

The present embodiment describes an example case involving an anode (in the present embodiment, the first electrode 21) formed in a matrix. The anode is, however, not particularly limited in terms of shape, material, or size as long as it has the function as an electrode for supplying positive holes to an organic EL layer. The anode may have, for example, a stripe shape. By the nature of an organic EL element, at least one of the anode and the cathode is preferably transparent. An organic EL element typically includes a transparent anode.

The present embodiment is not limited by the above values for the scan rate, the vapor deposition rate, and the number of reciprocating scans for the TFT substrate 10. Adjusting the above values makes it possible to achieve a desired film thickness in a desired tact time.

[Embodiment 2]

Embodiment 1 has dealt with an example case in which (i) there are a single vapor deposition region 210 and a single vapor deposition unnecessary region 230 arranged on a film formation substrate 200 along a substrate scanning direction and (ii) there is a single second shutter 111 provided in correspondence with the vapor deposition unnecessary region 230.

The present embodiment, in contrast, deals with a case in which, as illustrated in FIG. 23, (i) there are two vapor deposition regions 210a and 210b and two vapor deposition unnecessary regions 230c and 230d arranged alternately on a film formation substrate 200 along a substrate scanning direction and (ii) there are two second shutters 111a and 111b provided in correspondence with the vapor deposition unnecessary regions 230c and 230d. The film formation substrate 200 has (i) a boundary region 240a between the regions 210a and 230c, (ii) a boundary region 240b between the regions 230c and 210b, and (iii) a boundary region 240c between the regions 210b and 230d.

The description below deals with points on which the present embodiment differs from Embodiment 1, and thus does not deal with points common to the present embodiment and Embodiment 1.

In the present embodiment, the second shutter 111a has, along the substrate scanning direction, a length X that is determined from FIG. 24 to satisfy Expression 2 below.

[Math 2]

$$\frac{L2}{L1} \times (D + S1 + S2) \geq X \geq \frac{L2}{L1} \times D \qquad \text{Expression 2}$$

As illustrated in FIG. 24, in Expression 2: the symbol D represents the width of the vapor deposition unnecessary region 230c (to which the second shutter 111a corresponds) along the substrate scanning direction; the symbol L1 represents the interval between the injection holes 86 and the vapor deposition unnecessary region 230c; the symbol L2 represents the interval between the injection holes 86 and the second shutter 111a; the symbol S1 represents the width of the boundary region 240a (first boundary region) along the substrate scanning direction, the boundary region 240a being adjacent to the vapor deposition unnecessary region 230c and located on a first side thereof along the substrate scanning direction; and the symbol S2 represents the width of the boundary region 240b (second boundary region) along the substrate scanning direction, the boundary region 240b being adjacent to the vapor deposition unnecessary region 230c and located on a second side thereof along the substrate scanning direction.

Expression 2 defines the length X of the second shutter 111a as being not shorter than the segment $P_3P_4$ and not longer than the segment $P_7P_8$ as illustrated in FIG. 24. The points $P_1$ and $P_2$ represent respective opposite ends of the vapor deposition unnecessary region 230c along its width D.

The point $P_3$ represents the point of intersection of the segment $P_0P_1$ and the segment K1. The point $P_3$ represents the point of intersection of the segment $P_0P_2$ and the segment K1. The point $P_7$ represents the point of intersection of the segment $P_0P_5$ and the segment K1. The point $P_8$ represents the point of intersection of the segment $P_0P_6$ and the segment K1. The segment K1 is a segment that passes through the center of the second shutter 111a and that is parallel to the vapor deposition unnecessary region 230c. The point $P_5$ corresponds to an end of the boundary region 230a, which is adjacent to the vapor deposition unnecessary region 230c along the substrate scanning direction and located on a first side thereof, the above end being located on the first side of the boundary region 230a. The point $P_6$ corresponds to an end of the boundary region 240b, which is adjacent to the vapor deposition unnecessary region 230c along the substrate scanning direction and located on a second side thereof, the above end being located on the second side of the boundary region 240b.

The second shutter 111b also has, along the substrate scanning direction, a length X that is determined by Expression 2 similarly to the second shutter 111a.

Expression 2 may be fine-tuned in view of, for example, the respective thicknesses of the second shutters 111a and 111b, the shape of an end surface of the second shutter 111, and/or the shape of the injection holes 86 of the vapor deposition source 85. Further, adjusting L2 also allows Expression 2 to be satisfied for various widths D. This means that even if the vapor deposition unnecessary region varies in width D depending on the model of an organic EL panel, the present embodiment eliminates the need to prepare a large number of second shutters 111a and 111b, which can in turn reduce equipment costs. In addition, even if a substrate scan has caused the vapor deposition unnecessary region to move, Expression 2 is unchanged and always satisfied even during a substrate scan.

The present embodiment includes a shutter moving mechanism 110 for each of the second shutters 111a and 111b separately. This allows the second shutters 111a and 111b to be scanned independently of each other.

The second shutters 111a and 111b are, similarly to the second shutter 111 of Embodiment 1, each scanned simultaneously with a substrate scan to block a vapor deposition flow traveling toward the corresponding one of the vapor deposition unnecessary regions 230c and 230d.

More specifically, the second shutters 111a and 111b are scanned (that is, adjusted in position) as illustrated in FIGS. 25 through 27.

As illustrated in FIG. 23 and FIGS. 25 through 27, the description below uses (i) the term "total vapor deposition flow C" to refer to the entire vapor deposition flow that travels from the vapor deposition source 85 through the openings 82 to reach the TFT substrate 10 serving as the film formation substrate 200, (ii) the term "vapor deposition flows A1 and A2" to refer to portions of the total vapor deposition flow C which portions travel respectively toward the vapor deposition regions 210a and 210b of the TFT substrate 10, and (iii) the term "vapor deposition flows B1 and B2" to refer to portions of the total vapor deposition flow C which portions travel respectively toward the vapor deposition unnecessary regions 230c and 230d of the TFT substrate 10.

The start of a substrate scan has a state in which, as illustrated in FIG. 25, the vapor deposition region 210a has just reached (that is, entered) an area directly above an opening 82. In this state, only the vapor deposition flow A1 is present out of the four vapor deposition flows A1, A2, B1 and B2. The second shutters 111a and 111b are, in this state (escape period), so adjusted in position as not to block the vapor deposition flow A1 (that is, as to escape from the vapor deposition flow A1).

A further scan of the TFT substrate 10 achieves a state in which, as illustrated in FIG. 26, both the vapor deposition regions 210a and 210b and the vapor deposition unnecessary region 230c are present directly above the opening 82. The second shutter 111a is, in this state (control period 1), so adjusted in position as to block not the vapor deposition flows A1 and A2 traveling respectively toward the vapor deposition regions 210a and 210b but the vapor deposition flow B1 traveling toward the vapor deposition unnecessary region 230c corresponding to the second shutter 111a. The second shutter 111b is so adjusted in position as not to block the vapor deposition flows A1, A2, and B1.

The vapor deposition flow B1 travels toward the vapor deposition unnecessary region 230c, which does not correspond to the second shutter 111b. The vapor deposition flow B1 is thus not blocked by the second shutter 111b.

A still further scan of the TFT substrate 10 achieves a state in which, as illustrated in FIG. 27, only the vapor deposition unnecessary region 230d is present directly above the opening 82. In this state, only the vapor deposition flow B2 is present out of the four vapor deposition flows A1, A2, B1 and B2. The second shutter 111a is, in this state (control period 2), so adjusted in position as not to block the vapor deposition flow B2. The second shutter 111b is, on the other hand, so adjusted in position as to block the vapor deposition flow B1 (that is, a vapor deposition flow traveling toward the vapor deposition unnecessary region 230d corresponding to the second shutter 111b).

When a further scan of the TFT substrate 10 has caused the vapor deposition unnecessary region 230d to be absent from the position directly above the opening 82, the second shutters 111a and 111b, as in the case illustrated in FIG. 25, each enter an escape period.

Scanning the second shutters 111a and 111b as described above prevents vapor deposition particles from being deposited onto the vapor deposition unnecessary regions 230c and 230d, and allows vapor deposition particles to be deposited onto the vapor deposition regions 210a and 210b sufficiently. In the case where the TFT substrate 10 is scanned in the opposite direction, the second shutters 111a and 111b are scanned in the order of FIG. 27->FIG. 26->FIG. 25.

FIG. 28 is a plan view illustrating a state in which stripe-shaped patterns of respective luminescent layers 23R, 23G, and 23B of red (R), green (G), and blue (B) have been formed as described above on the vapor deposition regions 210a and 210b of the TFT substrate 10.

As illustrated in FIG. 28, the TFT substrate 10 prepared as above has no luminescent layer 23R, 23G, or 23B in the vapor deposition unnecessary regions 230b, 230c, 230e, and 230d (particularly, the vapor deposition unnecessary regions 230c and 230d). Conventional techniques unfortunately allow vapor-deposited films to be formed in the vapor deposition unnecessary regions 230c and 230d as well, and thus wipe off such vapor-deposited films in the vapor deposition unnecessary regions 230c and 230d with use of an organic solvent during a later step. The present embodiment, in contrast, produces an organic EL display device that has, due to the second shutters 111a and 111b, no vapor-deposited films formed in the vapor deposition unnecessary regions 230c and 230d. The present embodiment thus eliminates the need for the above wiping.

The present embodiment produces an organic EL display device through steps identical to those of Embodiment 1 except for the above. Those identical steps are not described here.

The present embodiment, as described above, (i) includes second shutters 111a and 111b in correspondence with a plurality of vapor deposition unnecessary regions 230c and 230d respectively, (ii) determines respective lengths X of the second shutters 111a and 111b to satisfy Expression 2, and (iii) uses the second shutters 111a and 111b to block only the respective vapor deposition flows B1 and B2 traveling toward the vapor deposition unnecessary regions 230c and 230d corresponding to the second shutters 111a and 111b respectively. This arrangement makes it possible to, even in the case where there are vapor deposition unnecessary regions 230c and 230d so provided on opposite sides of a vapor deposition region 210b as to sandwich the vapor deposition region 210b along a substrate scanning direction, achieve effects similar to those achieved by Embodiment 1.

The second shutters 111a and 111b are scanned in the order of FIG. 25->FIG. 26->FIG. 27 as described above in the case where, during a substrate scan, a vapor deposition region first reaches the position directly above an opening 82 and a vapor deposition unnecessary region next reaches the same position as described above. However, in the case where, during a substrate scan, a vapor deposition unnecessary region first reaches the position directly above an opening 82 and a vapor deposition region next reaches the same position, the second shutters 111a and 111b are scanned in the order of FIG. 27->FIG. 26->FIG. 25.

The present embodiment has dealt with a case in which there are two vapor deposition unnecessary regions 230c and 230d along a substrate scanning direction. In the case where there are three or more vapor deposition unnecessary regions along a substrate scanning direction, the present embodiment simply needs to include second shutters in correspondence with the respective vapor deposition unnecessary regions.

[Embodiment 3]

Embodiment 2 includes second shutters 111a and 111b in correspondence with a plurality of respective vapor deposition unnecessary regions 230c and 230d arranged along a substrate scanning direction. In other words, Embodiment 2 includes the same number of second shutters as the number of a plurality of vapor deposition unnecessary regions. The present embodiment, in contrast, includes second shutters in a number smaller than the number of a plurality of vapor deposition unnecessary regions. In other words, the present embodiment includes a second shutter in correspondence with a plurality of vapor deposition unnecessary regions.

The description below deals in detail with an example case in which, as illustrated in FIG. 29, there are three vapor deposition regions 210d, 210e, and 210f and three vapor deposition unnecessary regions 230g, 230h, and 230i present alternately on a TFT substrate 10 along a substrate scanning direction. The present embodiment, in this case, includes second shutters 111g and 111h in correspondence with the respective vapor deposition unnecessary regions 210d and 210e, but includes no second shutter in correspondence with the vapor deposition unnecessary region 210f. The vapor deposition unnecessary regions 210d and 210e are equal to each other in length along the substrate scanning direction.

The present embodiment also is arranged such that the second shutters 111g and 111h each (i) enter an area directly above an opening 82 of the shadow mask 81 from a first side and (ii) exit the area from a second side.

The present embodiment, after the start of a substrate scan, (i) causes the individual vapor deposition unnecessary regions 230g, 230h, and 230i to, for example, sequentially pass through a position directly above an opening 82 in that order as illustrated in FIG. 29, and simultaneously (ii) scans the second shutters 111g and 111h as in Embodiment 2. FIG. 29 illustrates a state in which, after a first second shutter 111g has entered an area directly above an opening 82 and exited the area through a substrate scan, a second shutter 111h has entered the area directly above the opening 82 to block a vapor deposition flow B3 traveling toward the vapor deposition unnecessary region 230h while not blocking vapor deposition flows A3 and A4 traveling toward the respective vapor deposition regions 210e and 210f.

The present embodiment is arranged such that, in order not to block the vapor deposition flows A3, A4, and B3 from the vapor deposition source 85, the initial second shutter 111g that has exited the area directly above the opening 82 and that is in an escape period is, for example, moved as indicated by the arrow Y. Specifically, the initial second shutter 111g is (i) moved over to the back surface side of the TFT substrate 10, (ii) returned to the first side of the shadow mask 81 (that is, the upstream side of the substrate scanning direction), and (ii) caused to correspond to the vapor deposition unnecessary region 230i for which no second shutter has yet entered an area directly above the shadow mask 81.

The present embodiment then causes the second shutter 111g to, as in Embodiment 2, block a vapor deposition flow traveling toward the vapor deposition unnecessary region 230i.

The above example, as described above, includes two second shutters 111g and 111h for three vapor deposition unnecessary regions 230g, 230h, and 230i. The above example thus causes the second shutter 111g to correspond to two vapor deposition unnecessary regions (more specifically, two vapor deposition unnecessary regions that are equal to each other in length along the substrate scanning direction) 230g and 230i.

The present embodiment, as described above, causes a second shutter 111g to first (i) enter an area directly above the shadow mask 81 from a first side together with a vapor deposition unnecessary region 230g corresponding to the second shutter 111g and exit the area to a second side, then (ii) return to the first side of the shadow mask 81 in such a manner as to escape from a vapor deposition flow traveling toward the TFT substrate 10, and finally (iii) correspond to a different vapor deposition unnecessary region 230i. This arrangement eliminates the need to include a second shutter for each vapor deposition unnecessary region, and thus makes it possible to reduce the number of second shutters.

The present embodiment causes a single second shutter 111g to correspond to a plurality of vapor deposition unnecessary regions 230g and 230i that are equal to each other in length along a substrate scanning direction. In the case where the present embodiment is varied to cause the second shutter 111g to correspond to a plurality of vapor deposition unnecessary regions that are different from each other in length along a scan substrate direction, it is simply necessary to (i) design the second shutter 111g so that it has a variable length along the substrate scanning direction as in Embodiment 4 below and (ii) change the length of the second shutter 111g to match the length of a corresponding vapor deposition unnecessary region.

[Embodiment 4]

The present embodiment includes a second shutter that is designed to be variable in length along a substrate scanning direction. The description below deals with this point with reference to FIGS. 30 through 32.

The present embodiment includes, as illustrated in FIG. 30, a second shutter 111k including a plurality (two in FIG. 30) of shutter constituting members 111k1 and 111k2 each in the shape of a flat plate that are so placed on top of each other as to overlap each other by an adjustable amount along a substrate scanning direction.

Specifically, the present embodiment adjusts the amount k of overlap between the shutter constituting members 111k1 and 111k2 along the substrate scanning direction to change the length X of the second shutter 111k along the substrate scanning direction. Maximizing the overlap amount k as illustrated in FIG. 31, for example, minimizes the length X of the second shutter 111k, whereas minimizing the overlap amount k as illustrated in FIG. 32, for example, maximizes the length X of the second shutter 111k.

The present embodiment changes the length X of the second shutter 111k so that the length X is equal to the width, along the substrate scanning direction, of a vapor deposition unnecessary region corresponding to the second shutter 111k. This arrangement makes it possible to cause a single second shutter 111k to correspond to a plurality of vapor deposition unnecessary regions that are different from each other in width.

In the present embodiment, the vapor deposition device 50 additionally includes a length changing mechanism for changing the length X of the second shutter 111k.

The present embodiment, as described above, includes a second shutter 111k including a plurality of second shutter constituting members 111k1 and 111k2 that are so placed on top of each other as to overlap each other by an adjustable amount. With this arrangement, adjusting the amount k of overlap between the shutter constituting members 111k1 and 111k2 can adjust the length X of the second shutter 111k.

[Embodiment 5]

The present embodiment differs from Embodiment 1 in that, as illustrated in FIG. 33, the second shutter 111 has, along a substrate scanning direction, a length X that is sufficient to close the openings 82 as viewed from the vapor deposition source 85. The present embodiment is described below in detail.

The present embodiment is arranged such that, as illustrated in FIG. 33, the vapor deposition unnecessary region 230 and the boundary region 240 have respective widths along the substrate scanning direction, the sum D11 of the widths being larger than the width Dm of the openings 82 of the shadow mask along the substrate scanning direction. The present embodiment is similar to Embodiment 1 in that, as illustrated in FIG. 33, there are a single vapor deposition region 210 and a single vapor deposition unnecessary region 230 arranged on the TFT substrate 10 along the substrate scanning direction.

The second shutter 111 of the present embodiment has, along the substrate scanning direction, a length X that is determined to satisfy Expression 3 below.

[Math 3]

$$X \geq \frac{L2}{L3} \times D_m \quad \text{Expression 3}$$

As illustrated in FIG. 33, in Expression 3, the symbol Dm represents the width of the openings 82 of the shadow mask 81 along the substrate scanning direction; the symbol L2 represents the interval between the injection holes 86 and the second shutter 111; and the symbol L3 represents the interval between the injection holes 86 and the shadow mask 81.

As illustrated in FIG. 34, Expression 3 is defined such that a triangle $P_0P_{10}P_{11}$ formed by the central point $P_0$ of each injection hole 86 and opposite end points $P_{10}$ and $P_{11}$ of each opening 82 along the substrate scanning direction is similar to a triangle $P_0P_3P_4$ formed by the central point $P_0$ and opposite end points $P_3$ and $P_4$ of the second shutter 111 along its length X.

The present embodiment scans the second shutter 111 as described below. The description below uses (i) the term "vapor deposition flow A" to refer to a portion of a total vapor deposition flow C traveling from the vapor deposition source 85 through the openings 82 toward the TFT substrate 10, the portion traveling toward the vapor deposition region 210, and (ii) the term "vapor deposition flow B" to refer to a portion of the total vapor deposition flow C, the portion traveling toward the vapor deposition unnecessary region 230.

At the start of a substrate scan, only the vapor deposition region 210 is present directly above the openings 82 as illustrated in FIG. 35. The shutter 111 is, in this state (escape period), so scanned as not to block the vapor deposition flow A.

A further substrate scan achieves a state in which, as illustrated in FIG. 36, the vapor deposition region 210 and the vapor deposition unnecessary region 230 are present directly above the openings 82. The second shutter 111 is, in this state (control period 1), so scanned as to block not the vapor deposition flow A but the vapor deposition flow B.

A still further substrate scan achieves a state in which, as illustrated in FIG. 37, only the vapor deposition unnecessary region 230 is present (that is, the vapor deposition region 210 is absent) directly above the openings 82. In this state (control period 2), the vapor deposition flow A is absent, and only the vapor deposition flow B is present. The second shutter 111 is, in this state, so scanned as to completely close the openings 82 as viewed from the vapor deposition source 85, and is stopped at that position (that is, the second shutter 111 is fixed in position relative to the vapor deposition source 85). Scanning the second shutter 111 as described above completely blocks the vapor deposition flow B.

The present embodiment, as described above, includes a second shutter 111 having a length X that is sufficient to close the openings 85 as viewed from the vapor deposition source 85. This arrangement allows the second shutter 111 to completely block a vapor deposition flow traveling from the vapor deposition source 85 through the openings 82 toward the TFT substrate 10.

The present embodiment, in the above blocking state, fixes the second shutter 111 in position relative to the vapor deposition source 85. This arrangement allows adjustment of the position of the second shutter 111 to be omitted.

The present embodiment scans the TFT substrate 10 with the vapor deposition source 85 and the shadow mask 81 fixed in position. In the opposite case, that is, in the case where the present embodiment scans the vapor deposition source 85 and the shadow mask 81 with the TFT substrate 10 fixed in position, the present embodiment can fix the second shutter 111 in position relative to the vapor deposition source 85 to simplify adjustment of the position of the second shutter 111 accordingly.

In the present embodiment, no vapor deposition flow passes through the openings 82 in the state where, as illustrated in FIG. 37, the second shutter 111 completely closes the openings 82 as viewed from the vapor deposition source 85. This means that the second shutter 111 functions as a shutter for switching on/off vapor deposition of a vapor deposition flow onto the TFT substrate 10. The present embodiment can thus omit the first shutter 89.

[Main Points]

As described above, a vapor deposition method of an embodiment of the present invention is a vapor deposition method for forming a film in a predetermined pattern on a film formation substrate, the vapor deposition method including the steps of: (a) preparing a mask unit including: a vapor deposition mask having an opening; and a vapor deposition source provided so as to face the vapor deposition mask, the vapor deposition mask and the vapor deposition source being fixed in position relative to each other; (b) while moving at least a first one of the mask unit and the film formation substrate relative to a second one thereof, depositing vapor deposition particles, emitted from the vapor deposition source, through the opening onto a vapor deposition region of the film formation substrate; and (c) blocking, with use of a shutter member, a first portion of a vapor deposition flow of the vapor deposition particles which first portion travels toward a vapor deposition unnecessary region of the film formation substrate.

The above arrangement prepares a movable shutter member, and adjusts the position of the shutter member so that the shutter member blocks a portion of a vapor deposition flow of vapor deposition particles traveling from the vapor deposition source through the opening of the vapor deposition mask toward the film formation substrate, the portion traveling toward a vapor deposition unnecessary region of the film formation substrate. The above arrangement can thus prevent vapor deposition on a vapor deposition unnecessary region without reducing the amount of vapor deposition on an edge section of a vapor deposition region.

The above arrangement allows for omission of a step of wiping off, with use of a solvent, vapor deposition particles deposited on a vapor deposition unnecessary region, and can thus prevent a problem arising from such a wiping step. The above arrangement eliminates the need to include a step of protecting a vapor deposition unnecessary region to prevent vapor deposition thereon. Further, the above arrangement can simply change the positional relationship between the shutter member and the vapor deposition source to handle a vapor deposition unnecessary region in various sizes. The above arrangement consequently makes it possible to provide a vapor deposition method that prevents vapor deposition on a vapor deposition unnecessary region without reducing the amount of vapor deposition on an edge section of a vapor deposition region.

The vapor deposition method of an embodiment of the present invention may desirably be arranged such that during the step (c), the shutter member is adjusted in position so that the vapor deposition particles to be deposited onto the film formation substrate has a vapor deposition range having an end that coincides with a boundary region between the vapor deposition region and the vapor deposition unnecessary region.

The above arrangement, in the case where the film formation substrate has a boundary region between the vapor deposition region and the vapor deposition unnecessary region, adjusts the position of the shutter member so that the vapor deposition particles to be deposited onto the film formation substrate has a vapor deposition range having an end that coincides with a boundary region. The above arrangement can thus prevent vapor deposition on a vapor deposition unnecessary region without reducing the amount of vapor deposition on an edge section of a vapor deposition region.

The vapor deposition method of an embodiment of the present invention may desirably be arranged such that the shutter member is provided so as to be parallel to the film formation substrate; and the shutter member has, along a direction of the relative movement, a length X that satisfies Expression 1 below,

[Math 1]

$$X \geq \frac{L2}{L1} \times D, \quad \text{Expression 1}$$

where D represents a width of the vapor deposition unnecessary region along the direction of the relative movement, L1 represents an interval between the vapor deposition source and the vapor deposition unnecessary region, and L2 represents an interval between the vapor deposition source and the shutter member.

With the above arrangement, the shutter member satisfies Expression 1. The above arrangement can thus determine an effective length X for the shutter member in the case where, for instance, there is only one vapor deposition region along the direction of the relative movement.

The vapor deposition method of an embodiment of the present invention may desirably be arranged such that the shutter member is provided so as to be parallel to the film formation substrate; the film formation substrate has (i) a first boundary region on a first side of the vapor deposition unnecessary region along a direction of the relative movement and (ii) a second boundary region on a second side of the vapor deposition unnecessary region along the direction of the relative movement; and the shutter member has, along the direction of the relative movement, a length X that satisfies Expression 2 below,

[Math 2]

$$\frac{L2}{L1} \times (D + S1 + S2) \geq X \geq \frac{L2}{L1} \times D, \quad \text{Expression 2}$$

where D represents a width of the vapor deposition unnecessary region along the direction of the relative movement, S1 represents a width of the first boundary region along the direction of the relative movement, S2 represents a width of the second boundary region along the direction of the relative movement, L1 represents an interval between the vapor deposition source and the vapor deposition unnecessary region, and L2 represents an interval between the vapor deposition source and the shutter member.

With the above arrangement, the shutter member has a length X that satisfies Expression 2. The above arrangement can thus determine an effective length X for the shutter member in the case where there a boundary region on each side of the vapor deposition unnecessary region.

The vapor deposition method of an embodiment of the present invention may desirably be arranged such that during the step (c), the shutter member, in order to block the first portion of the vapor deposition flow, enters an area directly above the vapor deposition mask together with the vapor deposition unnecessary region from a first side and exits the area to a second side, and then, in such a manner as to escape from the vapor deposition flow traveling toward the film formation substrate, is returned to the first side of the vapor deposition mask for use in blocking a second portion of the vapor deposition flow which second portion travels toward a vapor deposition unnecessary region different from the vapor deposition unnecessary region.

With the above arrangement, the shutter member enters an area directly above the vapor deposition mask together with the vapor deposition unnecessary region from a first side and exits the area to a second side, and then, in such a manner as to escape from the vapor deposition flow traveling toward the film formation substrate, is returned to the first side of the vapor deposition mask for use in blocking a second portion of the vapor deposition flow which second portion travels toward a vapor deposition unnecessary region different from the vapor deposition unnecessary region. The above arrangement thus eliminates the need to include a shutter member for each vapor deposition unnecessary region, and thus makes it possible to reduce the number of shutter members.

The vapor deposition method of an embodiment of the present invention may desirably be arranged such that the shutter member includes a plurality of shutter constituting members that are placed on top of each other so as to overlap each other by a variable amount along a direction of the relative movement.

With the above arrangement, the shutter member includes a plurality of shutter constituting members that are placed on top of each other so as to overlap each other by an adjustable amount along a direction of the relative movement. Thus, adjusting the amount of overlap between the individual shutter constituting members can change the length of the shutter member.

The vapor deposition method of an embodiment of the present invention may desirably be arranged such that in a case where the shutter member blocks the first portion of the vapor deposition flow, the shutter member has, along the direction of the relative movement, a length that is changed in correspondence with a width of the vapor deposition unnecessary region along the direction of the relative movement.

With the above arrangement, in the case where the shutter member blocks the first portion of the vapor deposition flow, the shutter member has, along the direction of the relative movement, a length that is changed in correspondence with a width of the vapor deposition unnecessary region along the direction of the relative movement. The above arrangement thus makes it possible to change the length of the shutter member to an appreciate length for each of a plurality of vapor deposition unnecessary regions that are different from each other in width.

The vapor deposition method of an embodiment of the present invention may desirably be arranged such that the shutter member has, along a direction of the relative movement, a length that allows the shutter member to close the opening as viewed from the vapor deposition source.

With the above arrangement, the shutter member has a length that allows it to close the opening as viewed from the vapor deposition source. Thus, with the above arrangement, the shutter member can completely block a vapor deposition flow that travels from the vapor deposition source through the opening toward the film formation substrate.

The vapor deposition method of an embodiment of the present invention may desirably be arranged such that during the shutter position adjustment step, the shutter member is, in a state in which the vapor deposition region is absent directly above the opening, fixed in position relative to the vapor deposition source so as to close the opening as viewed from the vapor deposition source.

With the above arrangement, the shutter member is, in a state in which the vapor deposition region is absent directly above the opening of the vapor deposition mask, fixed in position relative to the vapor deposition source so as to close the opening as viewed from the vapor deposition source. The above arrangement thus allows adjustment of the position of the shutter member to be omitted (in the case where the film formation substrate is scanned) or allows such adjustment to be simplified (in the case where the mask unit is scanned).

The vapor deposition method of an embodiment of the present invention may desirably be arranged such that the shutter member is placed so as to be parallel to the film formation substrate; and the shutter member has, along the direction of the relative movement, a width X that satisfies Expression 3 below,

[Math 3]

$$X \geq \frac{L2}{L3} \times D_m, \quad \text{Expression 3}$$

where Dm represents a width of the opening along the direction of the relative movement, L2 represents an interval between the vapor deposition source and the shutter member, and L3 represents an interval between the vapor deposition source and the opening.

With the above arrangement, the shutter member has a length X that satisfies Expression 3. The above arrangement can thus determine the length of the shutter member so that the shutter member can close the opening as viewed from the vapor deposition source.

The vapor deposition method of an embodiment of the present invention may desirably be arranged such that the film in the predetermined pattern is an organic layer for an organic electroluminescent device.

The vapor deposition method of an embodiment of the present invention may desirably be arranged such that the vapor deposition region corresponds to an image region of an organic electroluminescent device; and the vapor deposition unnecessary region corresponds to a sealing region to which a sealing substrate is to be adhered.

The vapor deposition method of an embodiment of the present invention may desirably be arranged such that the vapor deposition region corresponds to an image region of an organic electroluminescent device; and the vapor deposition unnecessary region corresponds to a terminal section region through which connection is to be established with an external circuit.

The above arrangement (i) allows a vapor-deposited film to be formed sufficiently on the vapor deposition region serving as an image region and (ii) prevents a vapor-deposited film from being formed on the vapor deposition unnecessary region serving as a terminal section region. The above arrangement thus makes it possible to produce an organic electroluminescent device having (i) good connection in the terminal section region and (ii) good light-emitting performance in a pixel region.

A vapor-deposited film of an embodiment of the present invention is desirably a vapor-deposited film formed by the vapor deposition method, the vapor-deposited film having a shape of a stripe, at least one end of the stripe being present in a boundary region between the vapor deposition region and the vapor deposition unnecessary region.

If there is mispositioning in formation of a pattern of a vapor-deposited film on the film formation substrate along the scanning direction, an end of the stripe-shaped vapor-deposited film which end is present at an end of the vapor deposition region may cause a pattern loss on the vapor deposition region. The above arrangement, however, causes the stripe-shaped vapor-deposited film to have an end in a boundary region. This allows a portion of the vapor-deposited film which portion is present on the boundary region to compensate for a film loss in the vapor deposition region even if there is mispositioning in formation of a pattern, thereby preventing a film loss. In other words, a portion of the vapor-deposited film which portion has been formed on a boundary region serves as a margin for pattern mispositioning.

A method of an embodiment of the present invention for producing an organic electroluminescent display device is a method for producing an organic electroluminescent display device, the method including: a TFT-substrate-and-first-electrode preparing step of preparing a first electrode on a TFT substrate; an organic layer vapor deposition step of depositing, on the TFT substrate, an organic layer including at least a luminescent layer; a second electrode vapor deposition step of depositing a second electrode; and a sealing step of sealing, with use of a sealing member, an organic electroluminescent device including the organic layer and the second electrode, at least one of the organic layer vapor deposition step, the second electrode vapor deposition step, and the sealing step including the step (a), the step (b), and the step (c) of the vapor deposition method.

The above arrangement makes it possible to produce an inexpensive organic electroluminescent device that is free from electric defects.

The present invention is not limited to the description of the embodiments above, but may be altered in various ways by a skilled person within the scope of the claims. Any embodiment based on a proper combination of technical means disclosed in different embodiments is also encompassed in the technical scope of the present invention.

INDUSTRIAL APPLICABILITY

The present invention is suitably applicable to, for example, a device and method for producing an organic EL display device which device and method are for use in a process of film formation such as a discriminative application formation of an organic layer for an organic EL display device.

REFERENCE SIGNS LIST

10 TFT substrate
81 shadow mask (vapor deposition mask)
82 opening
85 vapor deposition source 111, 111a, 111b, 111g, 111h second shutter (shutter member)
111k1, 111k2 shutter constituting member (second shutter constituting member)
200 film formation substrate
210, 210a, 210b, 210d, 210e, 210f vapor deposition region
230, 230c, 230d, 230g, 230i vapor deposition unnecessary region
240, 240a, 240b, 240c boundary region

The invention claimed is:

1. A vapor deposition method for forming a film in a predetermined pattern on a film formation substrate, the vapor deposition method comprising the steps of:
   (a) preparing a mask unit including:
      a vapor deposition mask having an opening; and
      a vapor deposition source provided so as to face the vapor deposition mask,
   the vapor deposition mask and the vapor deposition source being fixed in position relative to each other;
   (b) while moving at least a first one of the mask unit and the film formation substrate relative to a second one thereof, depositing vapor deposition particles, emitted from the vapor deposition source, through the opening onto a vapor deposition region of the film formation substrate; and
   (c) blocking, with use of a shutter member, a first portion of a vapor deposition flow of the vapor deposition particles which first portion travels toward a vapor deposition unnecessary region of the film formation substrate,
   wherein:
      during the step (c), the shutter member is adjusted in position so that the vapor deposition particles to be deposited onto the film formation substrate have a vapor deposition range having an end that coincides with a boundary region between the vapor deposition region and the vapor deposition unnecessary region.

2. The vapor deposition method according to claim 1, wherein:
   the shutter member is provided so as to be parallel to the film formation substrate; and
   the shutter member has, along a direction of the relative movement, a length X that satisfies Expression 1 below,

[Math 1]

$$X \geq \frac{L2}{L1} \times D, \qquad \text{Expression 1}$$

where D represents a width of the vapor deposition unnecessary region along the direction of the relative movement, L1 represents an interval between the vapor deposition source and the vapor deposition unnecessary region, and L2 represents an interval between the vapor deposition source and the shutter member.

3. The vapor deposition method according to claim 1, wherein:
   the shutter member is provided so as to be parallel to the film formation substrate;
   the film formation substrate has (i) a first boundary region on a first side of the vapor deposition unnecessary region along a direction of the relative movement and (ii) a second boundary region on a second side of the vapor deposition unnecessary region along the direction of the relative movement; and
   the shutter member has, along the direction of the relative movement, a length X that satisfies Expression 2 below,

[Math 2]

$$\frac{L2}{L1} \times (D + S1 + S2) \geq X \geq \frac{L2}{L1} \times D, \qquad \text{Expression 2}$$

where D represents a width of the vapor deposition unnecessary region along the direction of the relative movement, S1 represents a width of the first boundary region along the direction of the relative movement, S2 represents a width of the second boundary region along the direction of the relative movement, L1 represents an interval between the vapor deposition source and the vapor deposition unnecessary region, and L2 represents an interval between the vapor deposition source and the shutter member.

4. The vapor deposition method according to claim 1, wherein:
   during the step (c), the shutter member, in order to block the first portion of the vapor deposition flow, enters an area directly above the vapor deposition mask together with the vapor deposition unnecessary region from a first side and exits the area to a second side, and then, in such a manner as to escape from the vapor deposition flow traveling toward the film formation substrate, is returned to the first side of the vapor deposition mask for use in blocking a second portion of the vapor deposition flow which second portion travels toward a vapor deposition unnecessary region different from said vapor deposition unnecessary region.

5. The vapor deposition method according to claim 1, wherein:
   the shutter member includes a plurality of shutter constituting members that are placed on top of each other so as to overlap each other by a variable amount along a direction of the relative movement.

6. The vapor deposition method according to claim 5, wherein:
   in a case where the shutter member blocks the first portion of the vapor deposition flow, the shutter member has, along the direction of the relative movement, a length that is changed in correspondence with a width of the vapor deposition unnecessary region along the direction of the relative movement.

7. The vapor deposition method according to claim 1, wherein:
   the shutter member has, along a direction of the relative movement, a length that allows the shutter member to close the opening as viewed from the vapor deposition source.

8. The vapor deposition method according to claim 7, wherein:
   during the step (c), the shutter member is, in a state in which the vapor deposition region is absent directly above the opening, fixed in position relative to the vapor deposition source so as to close the opening as viewed from the vapor deposition source.

9. The vapor deposition method according to claim 7, wherein:
   the shutter member is placed so as to be parallel to the film formation substrate; and
   the shutter member has, along the direction of the relative movement, a width X that satisfies Expression 3 below,

[Math 3]

$$X \geq \frac{L2}{L3} \times D_m,$$ Expression 3 where Dm represents a width of the opening along the direction of the relative movement, L2 represents an interval between the vapor deposition source and the shutter member, and L3 represents an interval between the vapor deposition source and the opening.

10. The vapor deposition method according to claim 1, wherein:
the film in the predetermined pattern is an organic layer for an organic electroluminescent device.

11. The vapor deposition method according to claim 1, wherein:
the vapor deposition region corresponds to an image region of an organic electroluminescent device; and
the vapor deposition unnecessary region corresponds to a sealing region to which a sealing substrate is to be adhered.

12. The vapor deposition method according to claim 1, wherein:
the vapor deposition region corresponds to an image region of an organic electroluminescent device; and
the vapor deposition unnecessary region corresponds to a terminal section region through which connection is to be established with an external circuit.

13. A vapor-deposited film formed by a vapor deposition method recited in claim 1,
the vapor-deposited film having a shape of a stripe,
at least one end of the stripe being present in a boundary region between the vapor deposition region and the vapor deposition unnecessary region.

14. A method for producing an organic electroluminescent display device,
the method comprising:
a TFT-substrate-and-first-electrode preparing step of preparing a first electrode on a TFT substrate;
an organic layer vapor deposition step of depositing, on the TFT substrate, an organic layer including at least a luminescent layer;
a second electrode vapor deposition step of depositing a second electrode; and
a sealing step of sealing, with use of a sealing member, an organic electroluminescent device including the organic layer and the second electrode,
at least one of the organic layer vapor deposition step, the second electrode vapor deposition step, and the sealing step including the step (a), the step (b), and the step (c) of a vapor deposition method recited in claim 1.

* * * * *